US008754459B2

(12) United States Patent
Higuchi et al.

(10) Patent No.: US 8,754,459 B2
(45) Date of Patent: Jun. 17, 2014

(54) SEMICONDUCTOR MEMORY DEVICE

(71) Applicants: Masaaki Higuchi, Mie-ken (JP);
Masaru Kito, Mie-ken (JP)

(72) Inventors: Masaaki Higuchi, Mie-ken (JP);
Masaru Kito, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 13/728,311

(22) Filed: Dec. 27, 2012

(65) Prior Publication Data
US 2014/0061773 A1 Mar. 6, 2014

Related U.S. Application Data

(60) Provisional application No. 61/695,862, filed on Aug. 31, 2012.

(51) Int. Cl.
| | | |
|---|---|---|
| *H01L 27/108* | (2006.01) | |
| *H01L 27/105* | (2006.01) | |
| *H01L 27/11* | (2006.01) | |
| *H01L 27/115* | (2006.01) | |
| *H01L 21/8229* | (2006.01) | |
| *H01L 21/8239* | (2006.01) | |
| *H01L 27/112* | (2006.01) | |
| *H01L 29/68* | (2006.01) | |

(52) U.S. Cl.
CPC ............... *H01L 27/105* (2013.01); *H01L 27/11* (2013.01); *H01L 27/115* (2013.01); *H01L 21/8229* (2013.01); *H01L 21/8239* (2013.01); *H01L 27/112* (2013.01); *H01L 29/685* (2013.01)
USPC .......................................................... 257/296

(58) Field of Classification Search
CPC ..... H01L 27/105; H01L 27/11; H01L 27/115; H01L 21/8229; H01L 21/8239; H01L 27/112; H01L 29/685
USPC ..................... 257/68–71, 225–234, 255–266, 257/296–309, 314–326, 390, 905–908, 257/E29.17, E21.645–E21.694, 257/E27.084–E27.097, E21.646–E21.66, 257/E21.662, E21.666–E21.678, E27.075, 257/E27.078, E29.3–E29.309, 257/E27.098–E27.101, E27.077, 257/E21.179–E21.182, E21.209–E21.21, 257/E21.422, E21.423, E21.679–E21.694
See application file for complete search history.

(56) References Cited

U.S. PATENT DOCUMENTS

| | | | |
|---|---|---|---|
| 2007/0252201 A1 | 11/2007 | Kito et al. | |
| 2010/0019310 A1* | 1/2010 | Sakamoto | 257/324 |
| 2011/0103153 A1 | 5/2011 | Katsumata et al. | |
| 2011/0180796 A1* | 7/2011 | Yamazaki et al. | 257/57 |
| 2012/0052672 A1 | 3/2012 | Nakanishi et al. | |
| 2012/0119365 A1* | 5/2012 | Won | 257/750 |

* cited by examiner

*Primary Examiner* — Jae Lee
*Assistant Examiner* — Junaiden Mirsalahuddin
(74) *Attorney, Agent, or Firm* — Oblon, Spivak, McClelland, Maier & Neustadt, L.L.P.

(57) ABSTRACT

According to one embodiment, a semiconductor memory device includes a substrate, a stacked body, a plurality of insulative separating films, a channel body, and a memory film. The stacked body includes a plurality of electrode layers and a plurality of insulating layers. The plurality of insulative separating films separates the stacked body into a plurality. The channel body extends in the stacking direction between the plurality of insulative separating films. A width of the electrode layer of a lower layer side between the insulative separating film and the memory film is greater than a width of the electrode layer of an upper layer side between the insulative separating film and the memory film. An electrical resistivity of the electrode layer is higher for the electrode layer of the lower layer side having the greater width than for the electrode layer of the upper layer side having the lesser width.

20 Claims, 17 Drawing Sheets

SEMICONDUCTOR MEMORY DEVICE

CROSS-REFERENCE TO RELATED APPLICATION

This application is based upon and claims the benefit of priority from U.S. Provisional Patent Application 61/695,862, filed on Aug. 31, 2012; the entire contents of which are incorporated herein by reference.

FIELD

Embodiments described herein relate generally to a semiconductor memory device.

BACKGROUND

A memory device having a three-dimensional structure has been proposed in which memory holes are made in a stacked body in which insulating layers are multiply stacked alternately with electrode layers that function as control gates of memory cells, and silicon bodies used to form channels are provided on the side walls of the memory holes with a charge storage film interposed between the silicon bodies and the side walls.

In the memory device having such a three-dimensional structure, problems are known in which the memory hole diameter undesirably changes in the depth direction.

The difference of the memory hole diameter may lead to operating characteristic fluctuation due to the surface area of the electrode layer provided around the memory hole undesirably fluctuating between the different levels.

DETAILED DESCRIPTION

Figure 1:
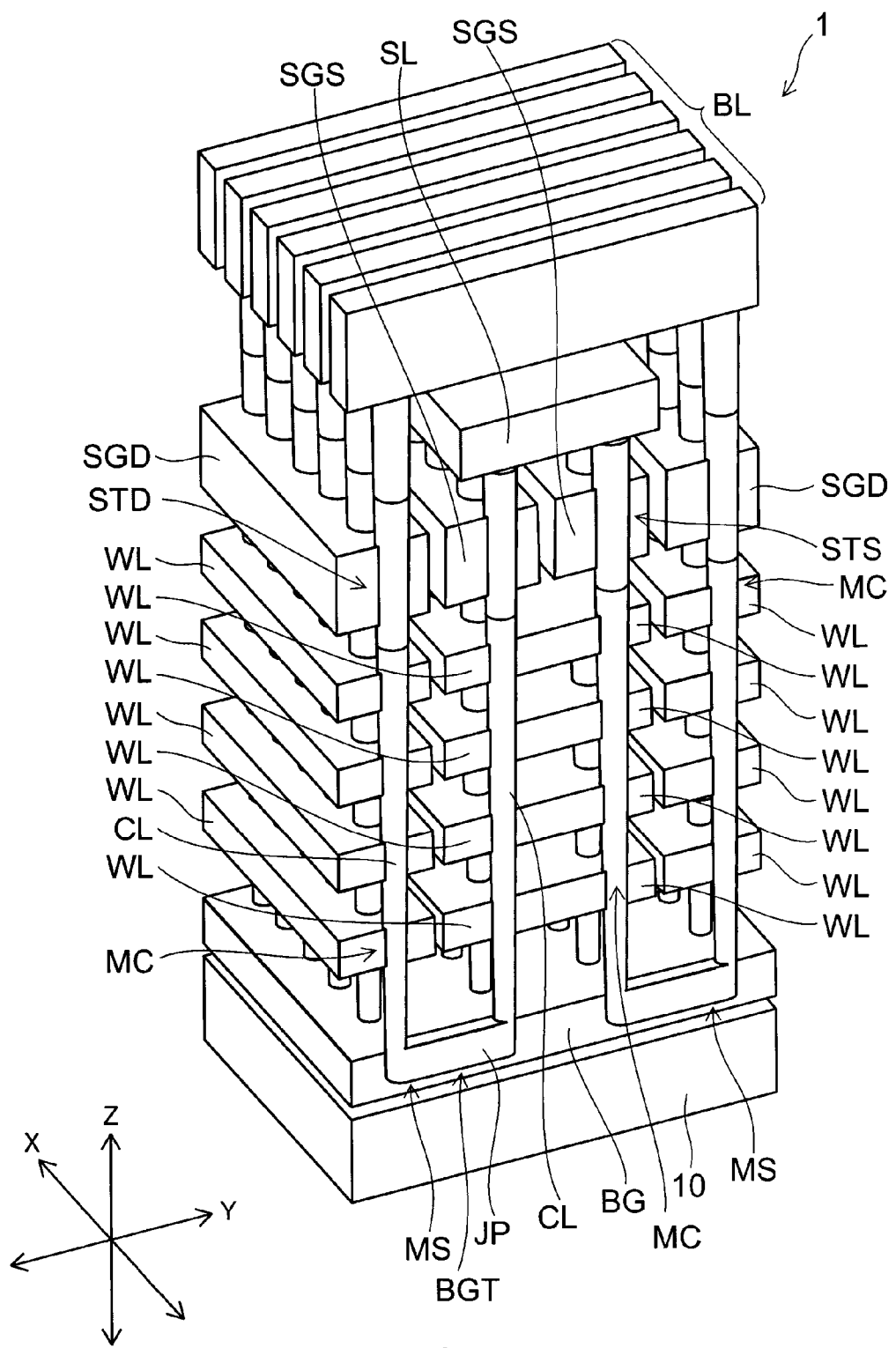
FIG. 1 is a schematic perspective view of a memory cell array of a semiconductor memory device of an embodiment.

According to one embodiment, a semiconductor memory device includes a substrate, a stacked body, a plurality of insulative separating films, a channel body, and a memory film. The stacked body includes a plurality of electrode layers provided above the substrate and a plurality of insulating layers provided respectively in each space between the electrode layers. The plurality of insulative separating films extends in a stacking direction of the electrode layers and the insulating layers inside the stacked body to separate the stacked body into a plurality. The channel body extends in the stacking direction inside the stacked body between the plurality of insulative separating films. The memory film is provided between the channel body and the electrode layers, and includes a charge storage film. A width of the electrode layer of a lower layer side between the insulative separating film and the memory film is greater than a width of the electrode layer of an upper layer side between the insulative separating film and the memory film. An electrical resistivity of the electrode layer is higher for the electrode layer of the lower layer side having the greater width than for the electrode layer of the upper layer side having the lesser width.

Embodiments will now be described with reference to the drawings. Similar components in the drawings are marked with like reference numerals.

FIG. 1 is a schematic perspective view of a memory cell array 1 of a semiconductor memory device of the embodiment. The insulating portions are not shown for easier viewing in FIG. 1.

An XYZ orthogonal coordinate system is introduced in FIG. 1. Two mutually orthogonal directions that are parallel to the major surface of a substrate 10 are taken as an X direction (a first direction) and a Y direction (a second direction); and a direction orthogonal to both the X direction and the Y direction is taken as a Z direction (a third direction or a stacking direction).

Figure 2:
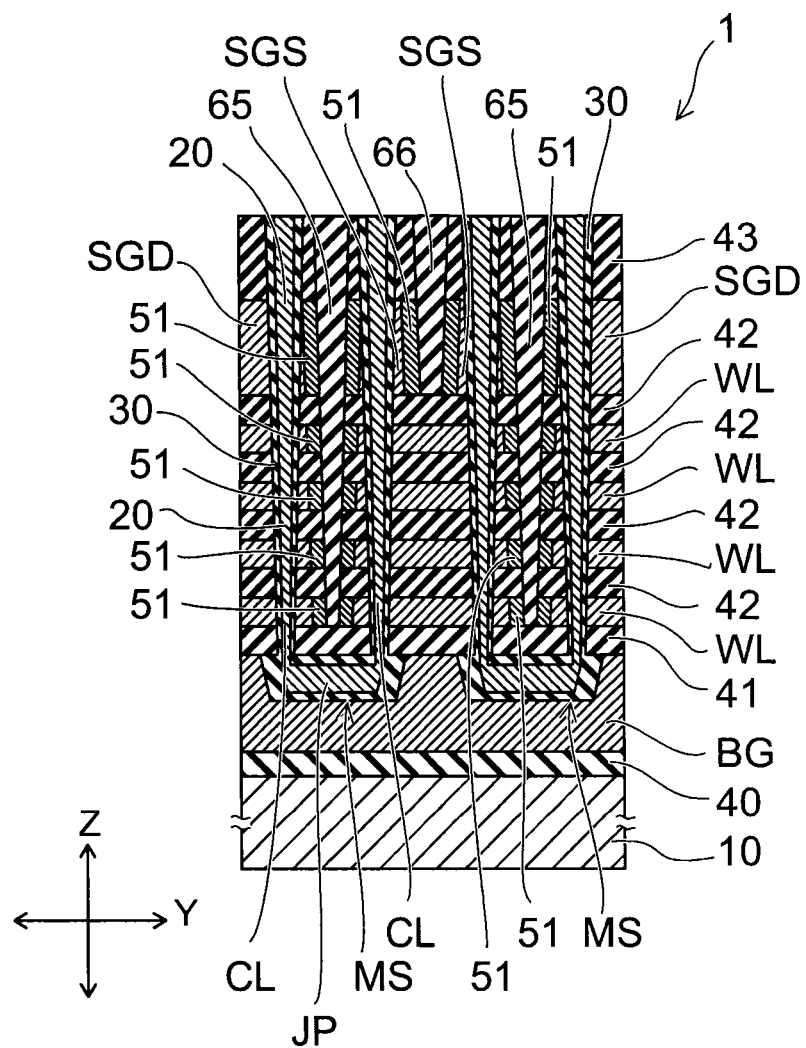
FIG. 2 is a schematic cross-sectional view of the memory cell array of the semiconductor memory device of the embodiment.

FIG. 2 is a schematic cross-sectional view of the memory cell array 1 and shows a cross section parallel to the YZ plane of FIG. 1.

The memory cell array 1 includes multiple memory strings MS. One memory string MS is formed in a U-shaped configuration including a pair of columnar portions CL extending in the Z direction and a linking portion JP that links the lower ends of the pair of the columnar portions CL.

Figure 3:
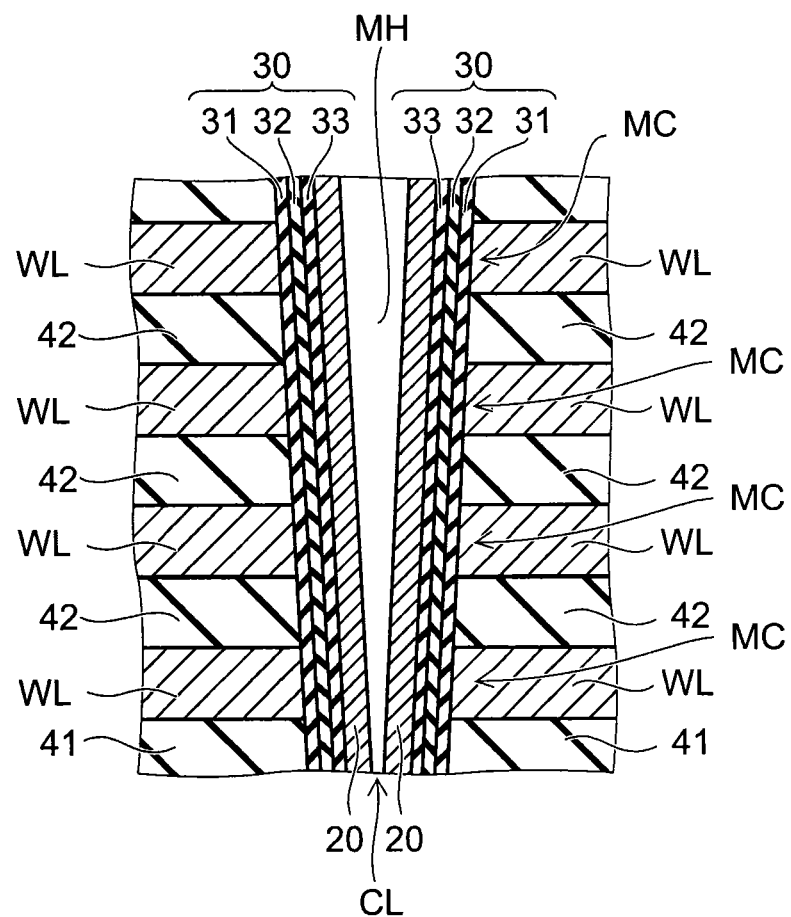
FIG. 3 is a schematic cross-sectional view of a memory cell of the semiconductor memory device of the embodiment.

FIG. 3 is an enlarged cross-sectional view of the columnar portion CL of the memory string MS.

A back gate BG is provided on the substrate 10 with the insulating layer 40 shown in FIG. 2 interposed. The back gate BG is a conductive layer, e.g., a silicon layer into which an impurity is added.

As shown in FIG. 2, an insulating layer 41 is provided on the back gate BG. A stacked body including multiple electrode layers WL and multiple insulating layers 42 is provided on the insulating layer 41. The electrode layers WL and the insulating layers 42 are stacked alternately in the Z direction; and the insulating layers 42 are provided between the electrode layers WL. The number of layers of the electrode layer WL is not limited to the number that is shown and is arbitrary.

The electrode layer WL is a polycrystalline silicon layer into which, for example, boron is added as an impurity and is sufficiently conductive to function as a control electrode of the memory cell.

The insulating layer 42 is, for example, a silicon oxide layer, a silicon nitride layer, or a silicon oxynitride layer.

A drain-side select gate SGD is provided at one upper end portion of the pair of the columnar portions CL of the memory string MS having the U-shaped configuration; and a source-side select gate SGS is provided at the other upper end portion. The drain-side select gate SGD and the source-side select gate SGS are provided on the electrode layer WL of the uppermost layer with the insulating layer 42 interposed between the drain-side select gate SGD and the electrode layer WL of the uppermost layer and between the source-side select gate SGS and the electrode layer WL of the uppermost layer.

The drain-side select gate SGD and the source-side select gate SGS are polycrystalline silicon layers into which, for example, boron is added as an impurity and are sufficiently conductive to function as gate electrodes of select transistors. The thickness of the drain-side select gate SGD and the thickness of the source-side select gate SGS are thicker than the thickness of each of the electrode layers WL.

A source line SL shown in FIG. 1 is provided on the source-side select gate SGS with an insulating layer 43 shown in FIG. 2 interposed. The source line SL is, for example, a metal film.

The bit lines BL shown in FIG. 1 which are multiple metal interconnects are provided on the drain-side select gate SGD and the source line SL with the insulating layer 43 shown in FIG. 2 interposed between the drain-side select gate SGD and the bit lines BL and between the source line SL and the bit lines BL. Each of the bit lines BL extends in the Y direction.

The memory string MS includes a channel body 20 having a U-shaped configuration provided inside the stacked body that includes the back gate BG, the multiple electrode layers WL, the insulating layer 41, the multiple insulating layers 42, the drain-side select gate SGD, and the source-side select gate SGS.

Figure 8A:
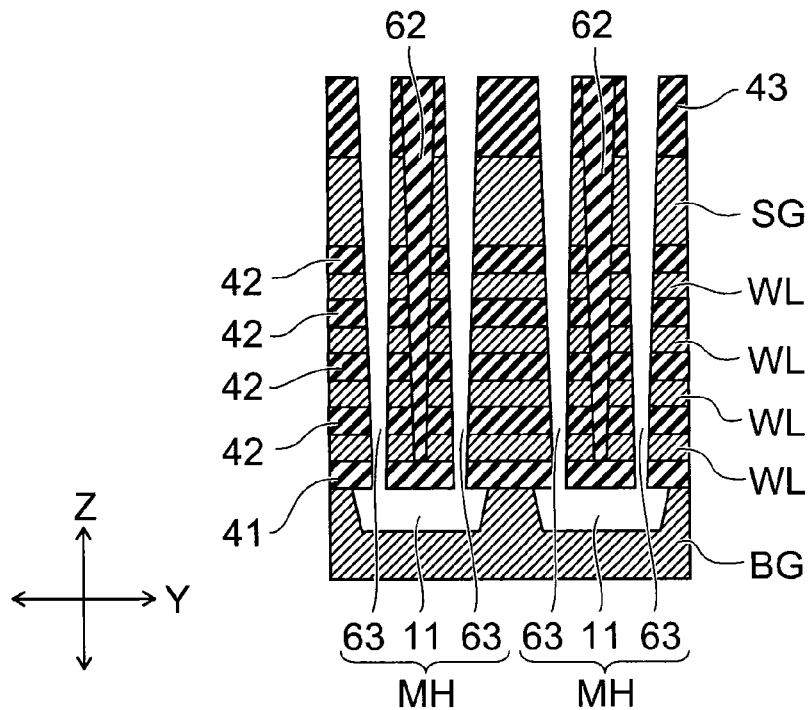

As shown in FIG. 8A described below, a memory hole MH having a U-shaped configuration is made in the stacked body recited above. The channel body 20 is provided inside the memory hole MH with a memory film 30 interposed. The channel body 20 extends in the Z direction inside the stacked body recited above and is provided also inside the back gate BG.

The channel body 20 is, for example, a silicon film or a mixed film of silicon and germanium. As shown in FIG. 3, the memory film 30 is provided between the channel body 20 and the inner wall of the memory hole MH.

Although the channel body 20 is provided such that a hollow portion remains at the central axis side of the memory hole MH in the structure shown in FIG. 3, this may be a structure in which the entire interior of the memory hole MH is filled with the channel body 20, or the hollow portion inside the channel body 20 is filled with an insulator.

The memory film 30 includes a blocking film 31, a charge storage film 32, and a tunneling film 33. The blocking film 31, the charge storage film 32, and the tunneling film 33 are provided in order from the electrode layer WL side between the channel body 20 and each of the electrode layers WL. The blocking film 31 contacts each of the electrode layers WL; the tunneling film 33 contacts the channel body 20; and the charge storage film 32 is provided between the blocking film 31 and the tunneling film 33.

The channel body 20 functions as a channel of memory cells (transistors) MC; the electrode layers WL function as control gates of the memory cells MC; and the charge storage film 32 functions as a data storage layer that stores the charge injected from the channel body 20. In other words, the memory cells MC are formed at the intersections between the channel body 20 and each of the electrode layers WL and have a structure in which the control gate is provided around the channel.

The semiconductor memory device of the embodiment is a nonvolatile semiconductor memory device that can freely and electrically erase/program data and retain the memory content even when the power supply is OFF.

The memory cell MC is, for example, a charge trap memory cell. The charge storage film 32 has many trap sites that trap the charge and is, for example, a silicon nitride film, an aluminum oxide film, a silicon oxynitride film, or a hafnium oxide film.

The tunneling film 33 is used as a potential barrier when the charge is injected from the channel body 20 into the charge storage film 32 or when the charge stored in the charge storage film 32 diffuses into the channel body 20. The tunneling film 33 is, for example, a silicon oxide film or a silicon oxynitride film.

The blocking film 31 prevents the charge stored in the charge storage film 32 from diffusing into the electrode layer WL. The blocking film 31 is, for example, a silicon oxide film, a silicon oxynitride film, or an aluminum oxide film.

The drain-side select gate SGD, the channel body 20, and the memory film 30 between the drain-side select gate SGD and the channel body 20 are included in a drain-side select transistor STD (shown in FIG. 1). The channel body 20 is connected to the bit line BL above the drain-side select gate SGD.

The source-side select gate SGS, the channel body 20, and the memory film 30 between the source-side select gate SGS and the channel body 20 are included in a source-side select transistor STS (shown in FIG. 1). The channel body 20 is connected to the source line SL above the source-side select gate SGS.

The back gate BG, the channel body 20 provided inside the back gate BG, and the memory film 30 provided inside the back gate BG are included in a back gate transistor BGT (shown in FIG. 1).

The memory cells MC having the electrode layers WL of each layer as control gates are multiply provided between the drain-side select transistor STD and the back gate transistor BGT. Similarly, the memory cells MC having the electrode layers WL of each layer as control gates are multiply provided between the back gate transistor BGT and the source-side select transistor STS.

The multiple memory cells MC, the drain-side select transistor STS, the back gate transistor BGT, and the source-side select transistor STS are connected in series via the channel body 20 and are included in one memory string MS having a U-shaped configuration. By the memory string MS being multiply arranged in the X direction and the Y direction, the multiple memory cells MC are provided three-dimensionally in the X direction, the Y direction, and the Z direction.

The electrode layer WL is separated into a plurality in the Y direction by an insulative separating film 65 shown in FIG. 2. As shown in FIG. 1, the electrode layer WL separated into the plurality in the Y direction by the insulative separating film 65 extends in the X direction. The electrode layer WL is provided commonly for the multiple columnar portions CL of the memory strings MS arranged in the X direction. The columnar portion CL includes the channel body 20 and the memory film 30. Accordingly, the electrode layer WL is shared between the multiple memory cells MC arranged in the X direction.

As shown in FIG. 2, the insulative separating film 65 is provided between a pair of the columnar portions CL included in the one memory string MS having the U-shaped configuration. The insulative separating film 65 extends in the Z direction inside the stacked body that includes the insulating layer 43, the drain-side select gate SGD, the source-side select gate SGS, the multiple insulating layers 42, and the multiple electrode layers WL and separates the stacked body recited above into a plurality in the Y direction. The insulative separating film 65 extends in the X direction (the direction piercing the page surface in FIG. 2).

The stacked body on the insulating layer 42 of the uppermost layer between the memory strings MS that are mutually adjacent in the Y direction is separated in the Y direction by an insulative separating film 66 extending in the Z direction. Accordingly, the source-side select gate SGS or the drain-side select gate SGD is separated between the memory strings MS that are mutually adjacent in the Y direction. The insulative separating film 66 extends in the X direction (the direction piercing the page surface in FIG. 2).

The insulative separating film 65 and the insulative separating film 66 are, for example, silicon nitride films or silicon oxide films.

A metal silicide 51 is formed in a portion of the electrode layer WL which is the silicon layer. The metal silicide 51 is, for example, nickel silicide or tungsten silicide. The metal silicide 51 is formed in the portion of the electrode layer WL adjacent to the insulative separating film 65.

The metal silicide 51 also is formed in a portion of the drain-side select gate SGD and in a portion of the source-side select gate SGS. The metal silicide 51 is formed in the portion of the drain-side select gate SGD adjacent to the insulative separating film 65 and in the portion of the drain-side select gate SGD adjacent to the insulative separating film 66. The metal silicide 51 is formed in the portion of the source-side select gate SGS adjacent to the insulative separating film 65 and in the portion of the source-side select gate SGS adjacent to the insulative separating film 66.

Figure 4A:
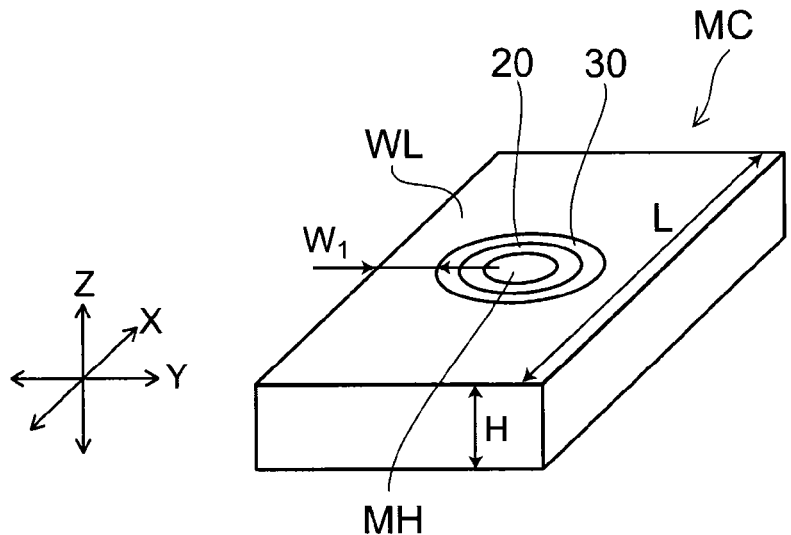
FIGS. 4A and 4B are schematic perspective views of the memory cell of the semiconductor memory device of the embodiment.
Figure 4B:
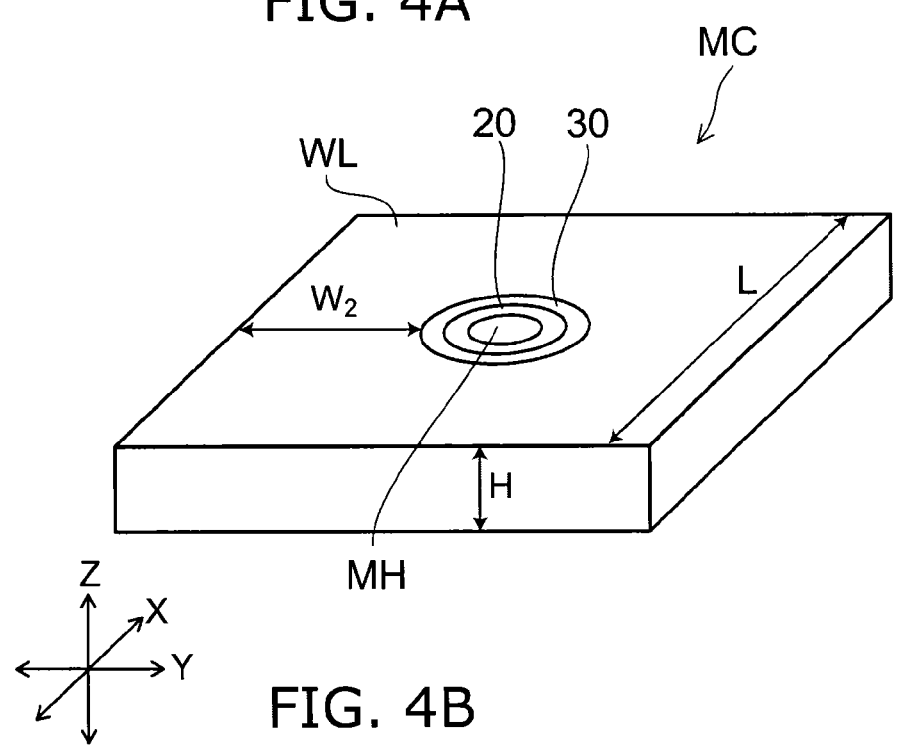

FIG. 4A is a schematic perspective view of the memory cell MC of the upper layer side; and FIG. 4B is a schematic perspective view of the memory cell MC of the lower layer side inside the same memory string MS that shares the memory cell MC and the channel body 20 of FIG. 4A.

The memory film 30 is formed in a tubular configuration at the side wall of the memory hole MH around the channel body 20. The channel body 20 is formed in a tubular configuration or a columnar configuration at the inner side of the memory film 30. The electrode layer WL is provided around the channel body 20 with the memory film 30 interposed.

The electrode layer WL of each of the memory cells MC is separated in the Y direction by the insulative separating film 65 described above. A length L in the X direction and a thickness H of each of the electrode layers WL of each of the electrode layers WL are substantially the same between the upper layer side and the lower layer side.

However, due to reasons of the processes described below, the width in the Y direction is different between the electrode layer WL of the upper layer side including at least the electrode layer WL of the uppermost layer and the electrode layer WL of the lower layer side including at least the electrode layer WL of the lowermost layer.

The width in the Y direction of the electrode layer WL of the lower layer side is wider than the width in the Y direction of the electrode layer WL of the upper layer side. In other words, a width $W_2$ of the electrode layer WL of the lower layer side shown in FIG. 4B between the insulative separating film 65 and the memory film 30 is wider than a width $W_1$ of the electrode layer WL of the upper layer side shown in FIG. 4A between the insulative separating film 65 and the memory film 30.

Also, according to the embodiment, although described below in detail, the electrical resistivity of the electrode layer WL of the lower layer side is set to be higher than the electrical resistivity of the electrode layer WL of the upper layer side.

Or, the electrode layer WL has a first region and a second region, where the material of the second region is different from that of the first region and the electrical resistivity of the second region is higher than that of the first region; and the width in the Y direction of the second region of the electrode layer WL of the lower layer side is set to be wider than the width in the Y direction of the second region of the electrode layer WL of the upper layer side.

Thus, even in the case where fluctuation of the width of the electrode layer WL in the Y direction occurs between the upper layer side and the lower layer side, the resistance of the electrode layer WL can be matched between the upper layer side and the lower layer side by changing the electrical resistivity of the electrode layer WL between the upper layer side and the lower layer side or by changing the width of the second region recited above between the upper layer side and the lower layer side; and the fluctuation of the operating characteristics can be suppressed.

A method for forming the memory cell array 1 of the embodiment will now be described with reference to FIG. 5A to FIG. 9B.

Figure 5A:
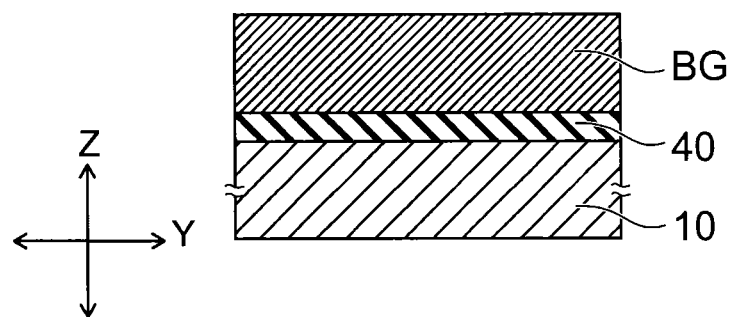
FIGS. 5A to 9B are schematic cross-sectional views showing a method for manufacturing the memory cell array of the semiconductor memory device of the embodiment.

As shown in FIG. 5A, the back gate BG is formed on the substrate 10 with the insulating layer 40 interposed. From FIG. 5B onward, the substrate 10 and the insulating layer 40 are not shown.

Figure 5B:
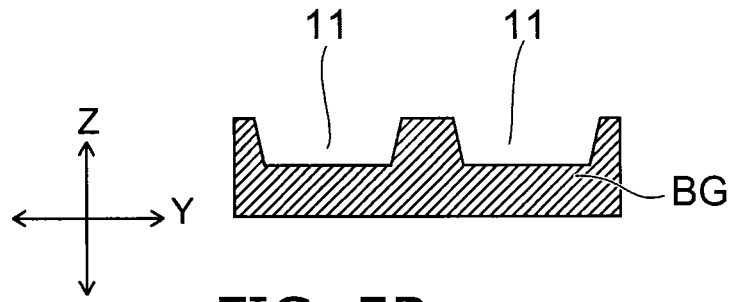

As shown in FIG. 5B, multiple trenches 11 are made in the back gate BG by etching using a not-shown mask.

Figure 5C:
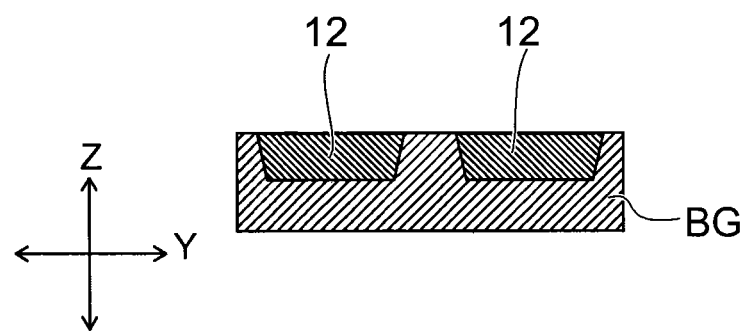

As shown in FIG. 5C, a sacrificial film 12 is filled into the trenches 11. The sacrificial film 12 is, for example, a silicon nitride film.

Figure 6A:
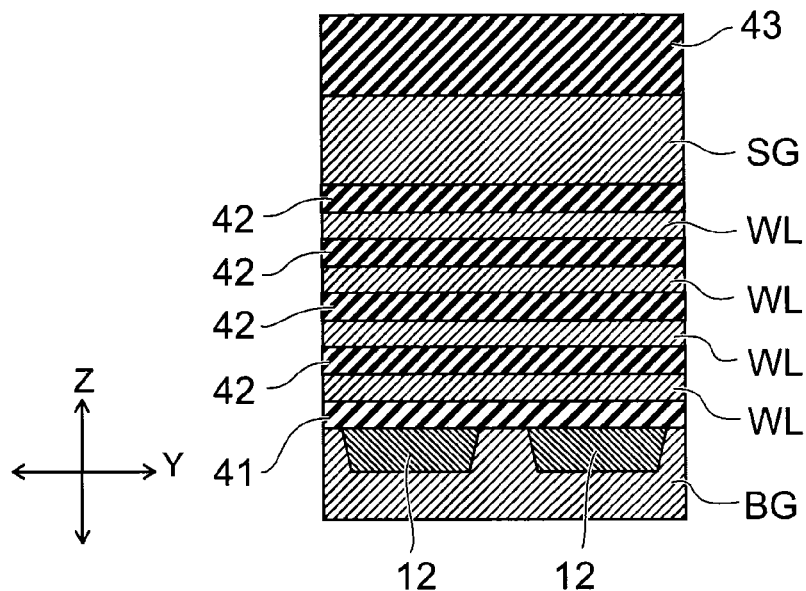

The protrusion upper surface of the back gate BG between the trenches 11 is exposed. The protrusion upper surface of the back gate BG and the upper surface of the sacrificial film 12 are planarized; and the insulating layer 41 is formed on the flat surfaces of the protrusion upper surface of the back gate BG and the upper surface of the sacrificial film 12 as shown in FIG. 6A.

The electrode layer WL and the insulating layer 42 are multiply stacked alternately on the insulating layer 41. A select gate SG used to form the drain-side select gate SGD or the source-side select gate SGS is formed on the electrode layer WL of the uppermost layer with the insulating layer 42 interposed; and the insulating layer 43 is formed on the select gate SG.

The back gate BG, the insulating layer 41, the electrode layers WL, the insulating layers 42, the select gate SG, and the insulating layer 43 are formed by, for example, CVD (chemical vapor deposition).

The number of layers of the electrode layer WL is arbitrary and is not limited to 4 layers. The number of layers of the insulating layer 42 also changes according to the number of layers of the electrode layer WL.

The back gate BG, the electrode layer WL, and the select gate SG are polycrystalline silicon layers into which, for example, boron is added as an impurity to provide the silicon layers with conductivity.

Figure 6B:
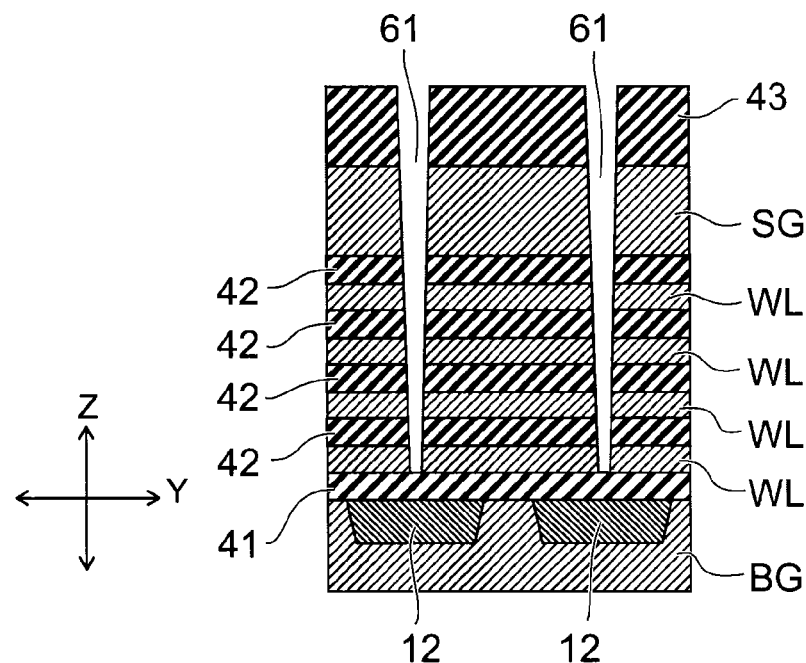

After forming the stacked body shown in FIG. 6A, multiple trenches 61 are made to reach the insulating layer 41 as shown in FIG. 6B by photolithography and etching. The trenches 61 are made on the sacrificial film 12 to divide the stacked body recited above in the Y direction. The trenches 61 extend in the X direction (the direction piercing the page surface in FIG. 6B).

Figure 7A:
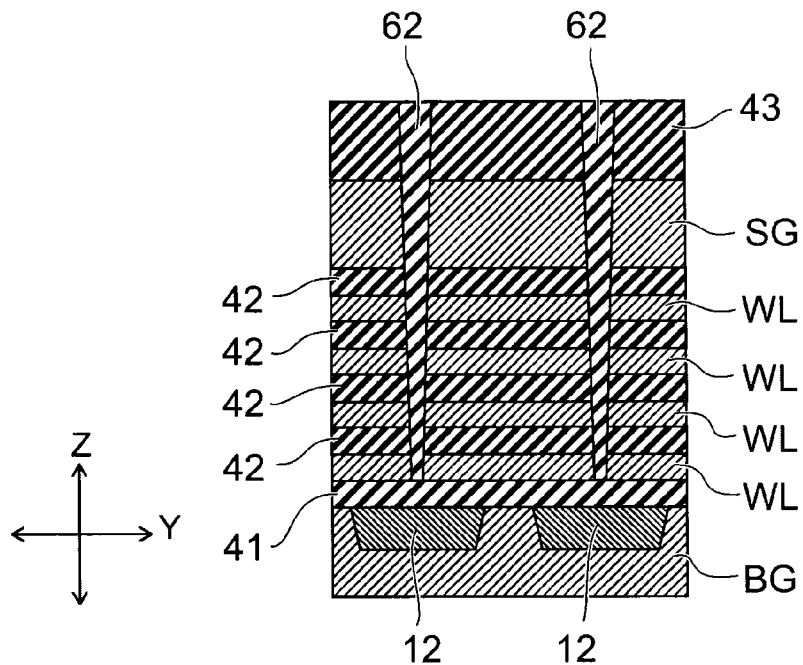

As shown in FIG. 7A, a sacrificial film 62 is filled into the trenches 61. The sacrificial film 62 is, for example, a silicon nitride film.

Figure 7B:
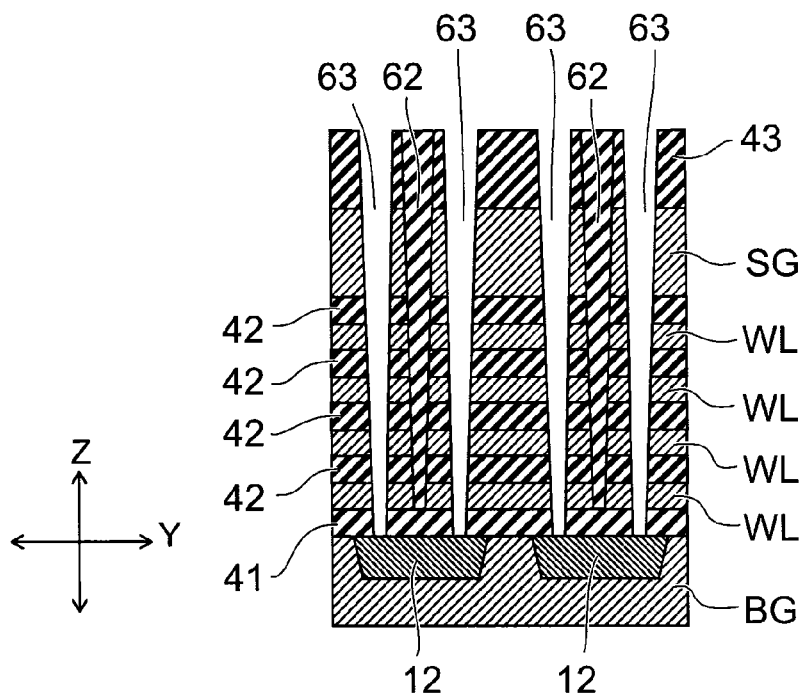

After forming the sacrificial film 62, multiple holes 63 are made in the stacked body recited above as shown in FIG. 7B. The holes 63 are made by, for example, RIE (reactive ion etching) using a not-shown mask.

Due to the processes at this time, in the case where the numbers of stacks of the electrode layer WL and the insulating layer 42 particularly increase and the aspect ratio of the holes 63 increases, the side walls of the holes 63 become tapered surfaces that are not perpendicular to the substrate major surface but are tilted; and the hole diameters of the holes 63 are smaller on the bottom side than on the top side.

The bottoms of the holes 63 reach the sacrificial film 12; and the sacrificial film 12 is exposed at the bottoms of the holes 63. A pair of holes 63 is made on one sacrificial film 12 on two sides of the sacrificial film 62 that separates the stacked body in the Y direction.

After making the holes 63, the sacrificial film 12 is removed by, for example, wet etching. The sacrificial film 12 is removed through the holes 63. The state after the wet etching is shown in FIG. 8A.

By the removal of the sacrificial film 12, the trenches 11 made in the back gate BG in the previous process appear. A pair of holes 63 communicates with one trench 11. In other words, each of the bottoms of the pair of holes 63 communicates with one common trench 11; and one memory hole MH having a U-shaped configuration is made.

Figure 8B:
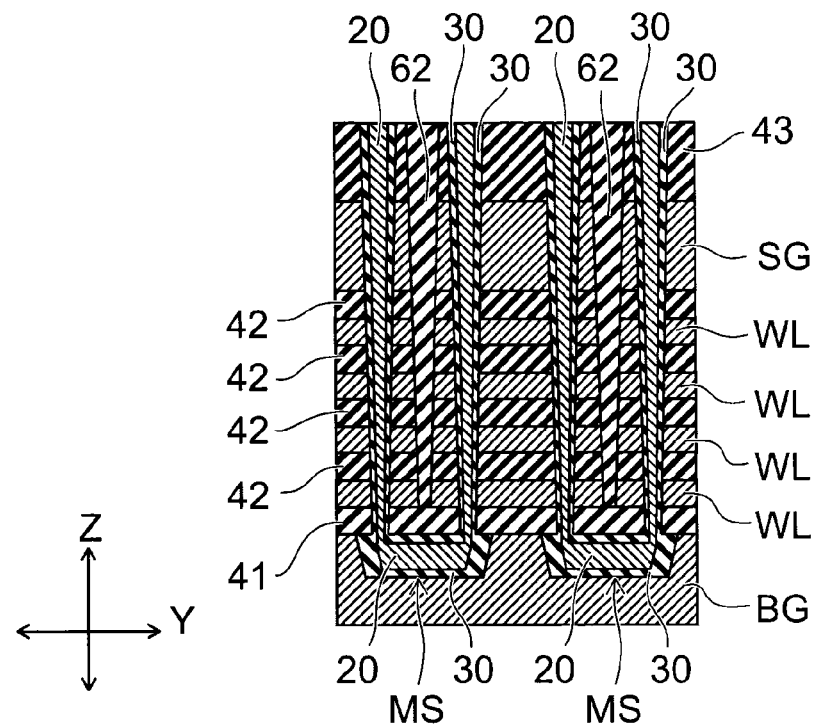

After forming the memory hole MH, the memory film 30 is formed at the inner wall of the memory hole MH as shown in FIG. 8B. After forming the memory film 30, the channel body 20 is formed on the inner side of the memory film 30 inside the memory hole MH. Thereby, the memory string MS having the U-shaped configuration is formed.

Figure 9A:
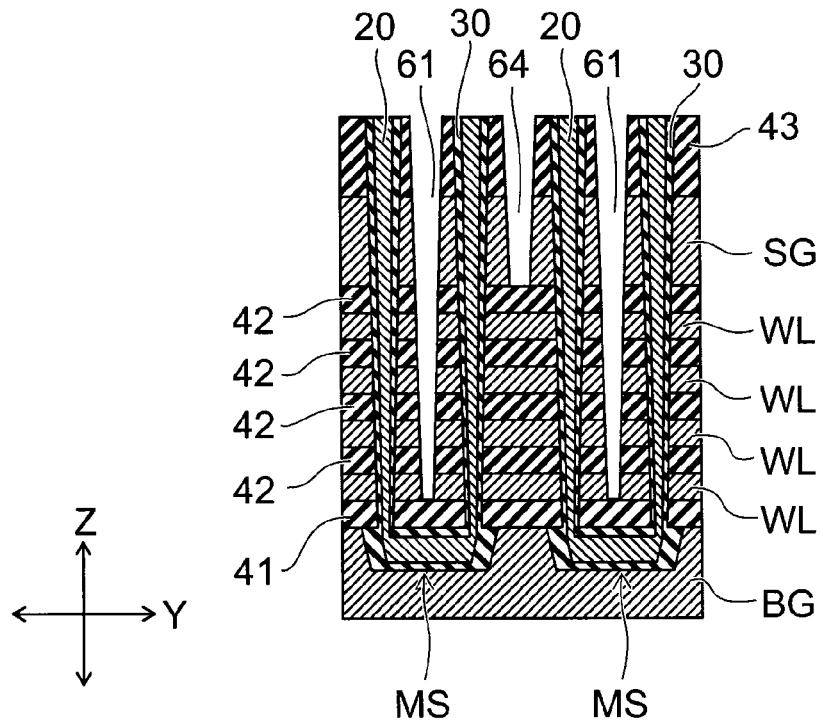

After forming the channel body 20, the sacrificial film 62 filled into the trenches 61 is removed by, for example, wet etching. As shown in FIG. 9A, a trench 64 is made in the select gate SG and the insulating layer 43 between the memory strings MS that are mutually adjacent in the Y direction. The trench 64 extends in the Z direction; and the bottom of the trench 64 reaches the insulating layer 42 of the uppermost layer and extends in the X direction (the direction piercing the page surface in FIG. 9A). The select gate SG and the insulating layer 43 between the memory strings MS that are mutually adjacent in the Y direction are separated in the Y direction by the trench 64.

Figure 9B:
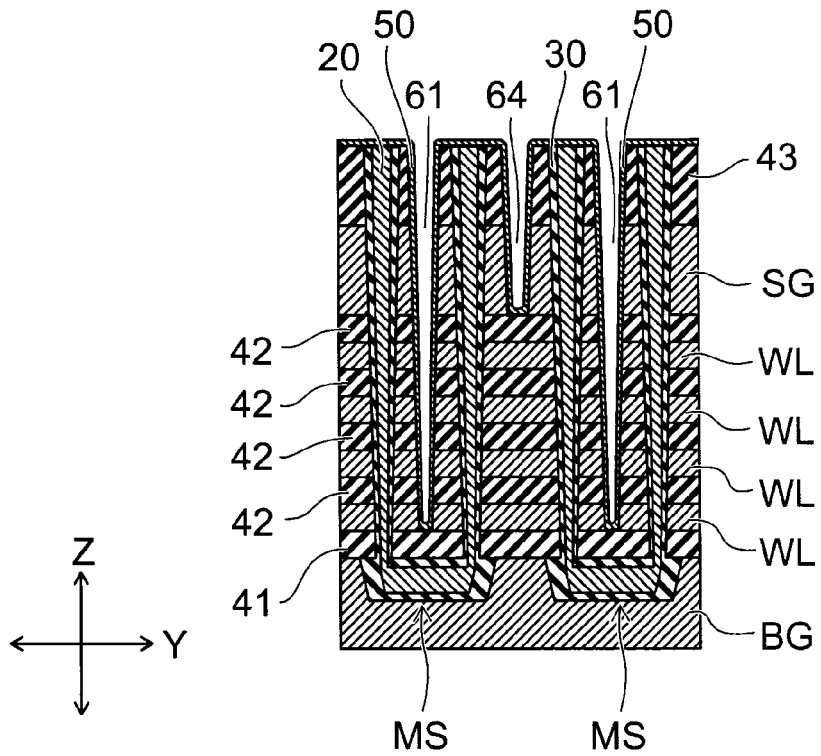

Then, as shown in FIG. 9B, a metal film 50 is formed conformally on the inner walls of the trenches 61 and on the inner wall of the trench 64. The metal film 50 is, for example, a nickel film or a tungsten film. The metal film 50 is formed in contact with the electrode layers WL and the select gate SG at the side walls of the trenches 61. Also, the metal film 50 is formed in contact with the select gate SG at the side wall of the trench 64.

After forming the metal film 50, the metal silicide 51 is formed in the electrode layers WL and the select gate SG as shown in FIG. 2 by causing the metal of the metal film 50 and the silicon of the electrode layers WL and the select gate SG to react by heat treatment. The metal silicide 51 is formed at least at the end portions of the electrode layers WL and the select gate SG on the trench 61 side and the trench 64 side.

After forming the metal silicide 51, the unreacted metal film 50 is removed; the insulative separating film 65 shown in FIG. 2 is formed inside the trenches 61; and the insulative separating film 66 shown in FIG. 2 is formed inside the trench 64.

Subsequently, not-shown contacts, the source line SL and the bit lines BL shown in FIG. 1, etc., are formed.

As shown in FIG. 7B, the holes 63 for which the ratio of the depth to the diameter increases have configurations in which the bottom side easily becomes finer than the top side.

Accordingly, as shown in FIG. 2, the diameter of the memory film 30 having the tubular configuration is smaller at the electrode layer WL of the lower layer side provided around the memory film 30 than at the electrode layer WL of the upper layer side provided around the memory film 30.

For the trench 61 shown in FIG. 6B into which the insulative separating film 65 is filled as well, in the case where the proportion of the depth to the width in the Y direction increases, the width in the Y direction of the bottom side easily becomes narrower than the width in the Y direction of the top side.

Accordingly, for the insulative separating film 65 shown in FIG. 2, the width of the lower portion of the insulative separating film 65 adjacent to the electrode layer WL of the lower layer side is narrower than the width of the upper portion of the insulative separating film 65 adjacent to the electrode layer WL of the upper layer side.

In the case where the diameter of the hole 63 changes in the depth direction, the surface area of the surfaces (the upper surface and the lower surface) of the electrode layer WL separated by the insulative separating film 65 in the Y direction and provided around the hole 63 undesirably changes between the electrode layer WL of the upper layer side and the electrode layer WL of the lower layer side. The surface area of the surfaces (the upper surface and the lower surface) provided around the hole 63 is greater for the electrode layer WL of the lower layer side provided around the hole 63 where the diameter is smaller than for the electrode layer WL of the upper layer side provided around the hole 63 where the diameter is larger.

In the case where the width of the insulative separating film 65 in the Y direction changes in the depth direction, the width of the electrode layer WL in the Y direction undesirably changes between the upper layer side and the lower layer side. The width in the Y direction is wider for the electrode layer WL of the lower layer side adjacent to the lower portion of the insulative separating film 65 where the width in the Y direction is narrower than for the electrode layer WL of the upper layer side adjacent to the upper portion of the insulative separating film 65 where the width in the Y direction is wider.

In other words, the width ($W_2$ in FIG. 4B) of the electrode layer WL of the lower layer side between the insulative separating film 65 and the memory film 30 is wider than the width ($W_1$ in FIG. 4A) of the electrode layer WL of the upper layer side between the insulative separating film 65 and the memory film 30.

The length of the electrode layer WL in the X direction (L in FIGS. 4A and B) is substantially the same between the electrode layer WL of the upper layer side and the electrode layer WL of the lower layer side. Accordingly, the surface area of the surface contacting the insulating layer 42 is greater for the electrode layer WL of the lower layer side where the width in the Y direction is wide than for the electrode layer WL of the upper layer side.

The current flows through each of the electrode layers WL in the X direction.

As described above, because the diameter of the hole 63 and the width of the trench 61 (the insulative separating film 65) in the Y direction change in the depth direction, the surface area of the surface contacting the insulating layer 42 at the electrode layer WL of the lower layer side is greater than the surface area of the surface contacting the insulating layer 42 at the electrode layer WL of the upper layer side.

The change of the surface area of the electrode layer WL changes the resistance of the electrode layer WL. In the case where the resistance of the electrode layer WL changes between the upper layer side and the lower layer side, a difference occurs between the signal propagation time of the electrode layer WL of the upper layer side and the signal propagation time of the electrode layer WL of the lower layer side; and fluctuation of the operation time of the programming, the erasing, the reading, etc., between the memory cells MC of the upper layer side and the memory cells MC of the lower layer side may occur.

Here, a resistance Rs of the electrode layer WL is shown by the following Formula (1), where the electrical resistivity (of the material) of the electrode layer WL is ρ, the width of the electrode layer WL in the Y direction is W, the length of the electrode layer WL in the X direction is L, and the thickness of the electrode layer WL in the Z direction is H.

$$Rs = \rho \frac{L}{H \times W} \quad (1)$$

Due to the dimensional change in the depth direction of the hole 63 and the trench 61 described above, the width W in the Y direction of the electrode layer WL fluctuates.

Therefore, according to the embodiment, the fluctuation of the resistance Rs of the electrode layer WL due to the fluctuation of the width W in the Y direction is corrected by changing the electrical resistivity ρ.

In other words, the electrical resistivity ρ of the electrode layer WL of the lower layer side where the width W is wide is higher than the electrical resistivity ρ of the electrode layer WL of the upper layer side where the width W is narrow.

This is not limited to the electrical resistivity being different for each electrode layer WL of the levels. At least, the width in the Y direction of the electrode layer WL of the lowermost layer is wider than the width in the Y direction of the electrode layer WL of the uppermost layer, and the electrical resistivity of the electrode layer WL of the lowermost layer is higher than the electrical resistivity of the electrode layer WL of the uppermost layer.

It is sufficient to be able to suppress the fluctuation of the resistance Rs among each of the electrode layers WL inside one memory string MS to be within a range that does not affect the operations. There are cases where the electrical resistivity is adjusted to be the same between the multiple electrode layers WL of different layers in consideration of the difference of the width in the Y direction.

According to the embodiment, the fluctuation of the operation time due to the shift of the signal propagation times can be suppressed by suppressing the fluctuation of the resistance Rs among each of the electrode layers WL inside one memory string MS.

The electrical resistivity of the electrode layer WL can be changed by the concentration of the additive.

For example, the additive to increase the electrical resistivity of the electrode layer WL is included in a higher concentration in the electrode layer WL of the lower layer side than in the electrode layer WL of the upper layer side.

In the case where a material having a silicon base such as a metal silicide layer, a polycrystalline silicon layer that includes an impurity such as, for example, boron and the like and is conductive, etc., are used as the electrode layer WL, the electrical resistivity of the electrode layer WL can be higher by adding carbon as the additive recited above to the polycrystalline silicon layer or the metal silicide layer than for the case where the carbon is not added. The electrical resistivity of the electrode layer WL increases as the carbon concentration is increased.

Figure 11A:
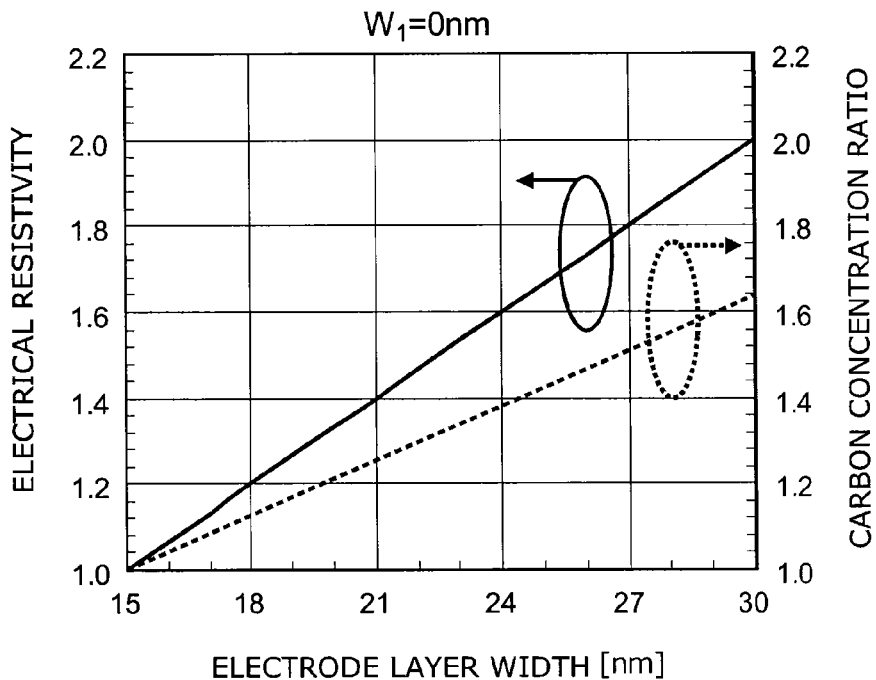
FIGS. 11A to 12B are graphs showing a relationship of a carbon concentration ratio and an electrical resistivity to a width of an electrode layer.

FIG. 11A is a graph of the calculation results of the electrical resistivity and the carbon concentration ratio to cause the resistance Rs of the electrode layer WL to be constant over the change of the width (the width in the Y direction) of the electrode layer WL which is the polycrystalline silicon layer.

The calculations were made for the width of the electrode layer WL in a range from 15 nm to 30 nm.

The carbon concentration ratio shown on the vertical axis on the right side is the ratio in the case where the carbon concentration (atomic percent) of the electrode layer WL having the width of 15 nm was taken to be 1.

The electrical resistivity shown on the vertical axis on the left side is the ratio in the case where the electrical resistivity of the electrode layer WL having the width of 15 nm is taken to be 1.

To cause the resistance Rs of the electrode layer WL shown in Formula (1) recited above to be constant regardless of the width of the electrode layer WL, the electrical resistivity of each of the electrode layers WL is appropriately set according to the difference of the widths W by setting the carbon concentration ratio shown in FIG. 11A according to the difference of the widths of each of the electrode layers WL.

The electrical resistivity of the electrode layer WL at the electrode layer WL of the upper layer side where the width is narrow is reduced by causing the carbon concentration to be relatively low; and the electrical resistivity of the electrode layer WL at the electrode layer WL of the lower layer side where the width is wide is increased by causing the carbon concentration to be relatively high. As a result, the resistance Rs can be matched between the electrode layers WL having different widths.

The carbon is added and the electrical resistivity is increased at least for the electrode layer WL of the lowermost layer. However, to ensure a sufficient conductivity to function as the electrode layer WL, it is desirable for the carbon concentration to be not more than 5 atomic percent.

There are cases where the carbon is not added for the electrode layer WL of the upper layer side where the width is narrow because the electrical resistivity is not increased.

Accordingly, the carbon concentration is set to be within a range not less than 0 and not more than 5 atomic percent.

In the case where a material having a silicon base such as a metal silicide layer, a polycrystalline silicon layer that is conductive, etc., is used as the electrode layer WL, the additive to increase the electrical resistivity of the electrode layer WL is not limited to carbon; and nitrogen can be used.

The electrical resistivity of the electrode layer WL can be higher by adding nitrogen to the polycrystalline silicon layer or the metal silicide layer than for the case where the nitrogen is not added. The electrical resistivity of the electrode layer WL increases as the nitrogen concentration is increased.

The nitrogen is added and the electrical resistivity is increased at least for the electrode layer WL of the lowermost layer. However, to ensure a sufficient conductivity to function as the electrode layer WL, it is desirable for the nitrogen concentration to be not more than 5 atomic percent.

There are cases where the nitrogen is not added to the electrode layer WL of the upper layer side where the width is narrow because the electrical resistivity is not increased.

Accordingly, the nitrogen concentration is set to be within a range not less than 0 and not more than 5 atomic percent.

The carbon can be added to the electrode layer WL when forming the electrode layer WL having the silicon base by CVD by introducing, for example, $C_2H_4$ gas into the chamber as the gas including carbon.

The nitrogen can be added to the electrode layer WL when forming the electrode layer WL having the silicon base by CVD by introducing, for example, $NH_3$ gas into the chamber as the gas including nitrogen.

Also, a metal layer can be used as the electrode layer WL. In the case where a tungsten layer including, for example, tungsten as the main component is used as the electrode layer WL, the electrical resistivity of the electrode layer WL can be higher by adding oxygen as the additive to the tungsten layer than for the case where the oxygen is not added.

The electrical resistivity of the electrode layer WL at the electrode layer WL of the upper layer side where the width is narrow is reduced by causing the oxygen concentration inside the tungsten layer to be relatively low; and the electrical resistivity of the electrode layer WL at the electrode layer WL of the lower layer side where the width is wide is increased by causing the oxygen concentration inside the tungsten layer to be relatively high. As a result, the resistance Rs can be matched between the electrode layers WL having different widths.

The electrical resistivity of the electrode layer WL can be higher by adding the nitrogen as the additive to the tungsten layer than for the case where the nitrogen is not added.

The electrical resistivity of the electrode layer WL at the electrode layer WL of the upper layer side where the width is narrow is reduced by causing the nitrogen concentration inside the tungsten layer to be relatively low; and the electrical resistivity of the electrode layer WL at the electrode layer WL of the lower layer side where the width is wide is increased by causing the nitrogen concentration inside the tungsten layer to be relatively high. As a result, the resistance Rs can be matched between the electrode layers WL having different widths.

Figure 16:
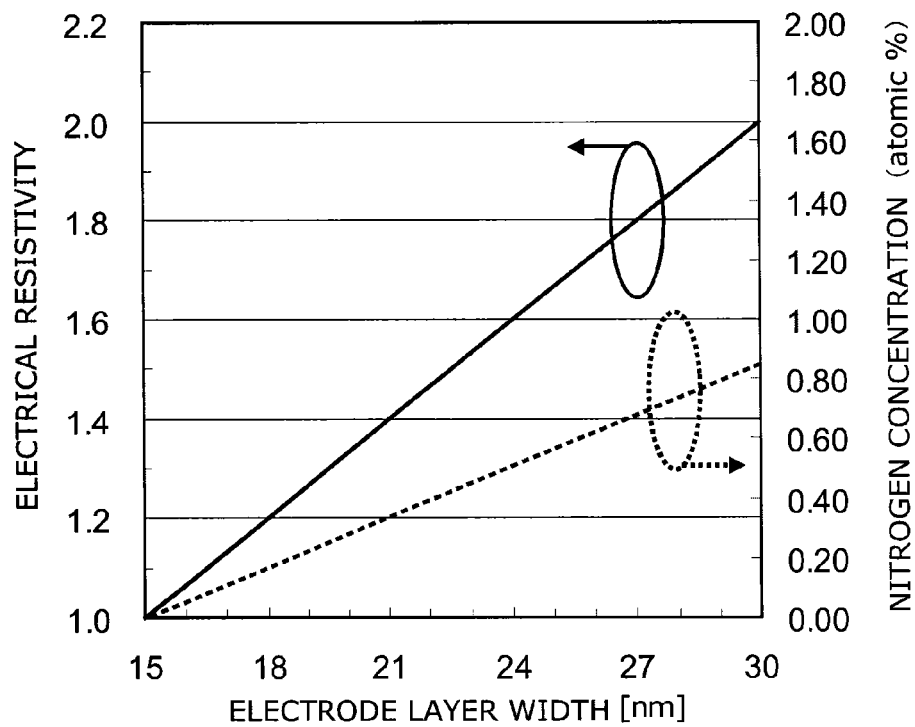
FIG. 16 is a graph showing a relationship of a nitrogen concentration ratio and an electrical resistivity to a width of an electrode layer.

FIG. 16 is a graph of the calculation results of the electrical resistivity and the nitrogen concentration (atomic percent) to cause the resistance Rs of the electrode layer WL to be constant over the change of the width (the width in the Y direction) of the electrode layer WL which is the tungsten layer including tungsten as the main component.

The calculations were made for the width of the electrode layer WL in a range from 15 nm to 30 nm.

The electrical resistivity shown on the vertical axis on the left side is the ratio in the case where the electrical resistivity of the electrode layer WL having the width of 15 nm is taken to be 1.

To cause the resistance Rs of the electrode layer WL to be constant regardless of the width of the electrode layer WL, the electrical resistivity of each of the electrode layers WL is appropriately set according to the difference of the widths W by setting the nitrogen concentration shown in FIG. 16 according to the difference of the widths of each of the electrode layers WL.

Also, a metal nitride layer can be used as the electrode layer WL. In the case where, for example, a tantalum nitride layer is used as the electrode layer WL, the electrical resistivity of the electrode layer WL can be increased by increasing the nitrogen concentration.

The electrical resistivity of the electrode layer WL at the electrode layer WL of the upper layer side where the width is narrow is reduced by causing the nitrogen concentration inside the tantalum nitride layer to be relatively low; and the electrical resistivity of the electrode layer WL at the electrode layer WL of the lower layer side where the width is wide is increased by causing the nitrogen concentration inside the tantalum nitride layer to be relatively high. As a result, the resistance Rs can be matched between the electrode layers WL having different widths.

The additive to increase the electrical resistivity of the electrode layer WL is not limited to being added to the entire electrode layer WL and may be added only to a region of a portion of the electrode layer WL.

Figure 13:
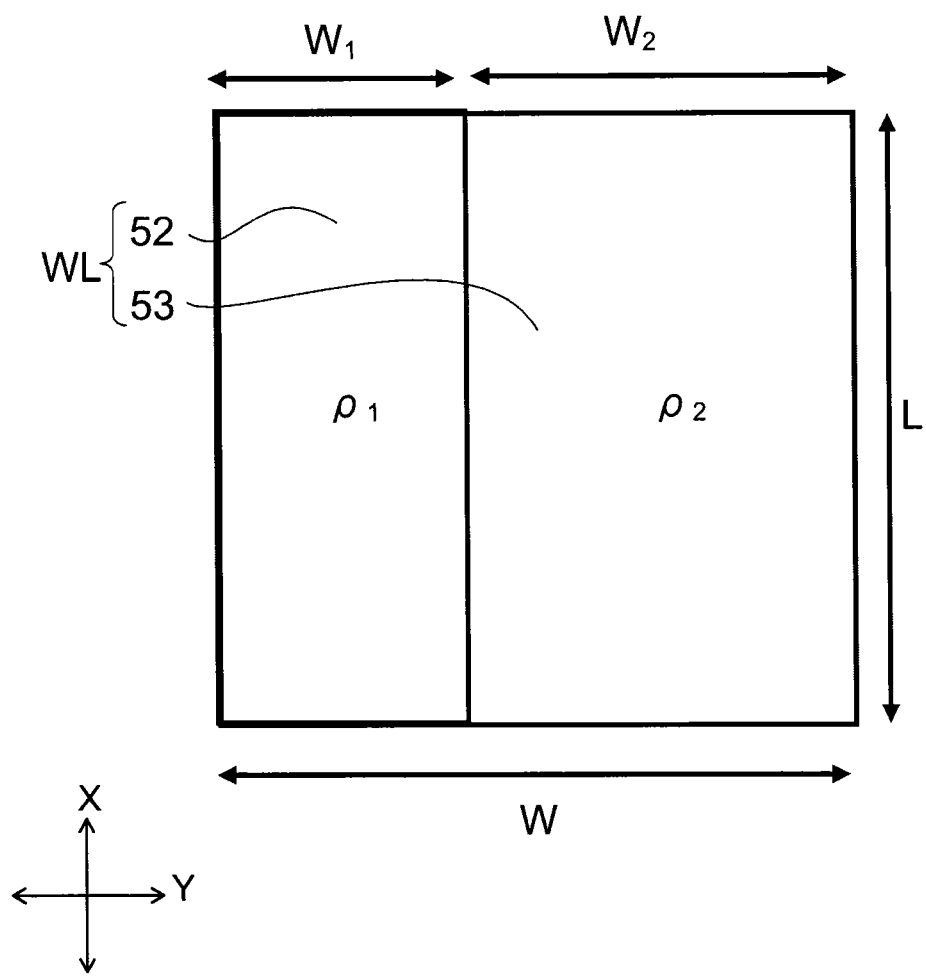
FIG. 13 is a schematic plan view of an electrode layer of the semiconductor memory device of the embodiment.

FIG. 13 is a schematic plan view of the electrode layer WL that includes a first region 52 not including the additive to increase the electrical resistivity of the electrode layer WL and a second region 53 including the additive to increase the electrical resistivity of the electrode layer WL.

The electrode layer WL is separated in the Y direction by the insulative separating film 65 described above. The electrode layer WL is divided into two regions inside the XY plane.

The electrode layer WL which is the metal silicide layer or the polycrystalline silicon layer that is conductive is divided into the first region 52 and the second region 53 that are adjacent in the Y direction; and carbon or nitrogen is added to only the second region 53 as the additive to increase the electrical resistivity of the electrode layer WL. The carbon or the nitrogen is not added to the first region 52; and the electrical resistivity $\rho_1$ of the first region 52 is lower than the electrical resistivity $\rho_2$ of the second region 53.

The length L in the X direction is substantially the same between the first region 52 and the second region 53; and the thickness H also is substantially the same between the first region 52 and the second region 53. The resistance Rs of the entire electrode layer WL is shown by the following Formula (2), where the width of the entire electrode layer WL in the Y direction is W, the width of the first region 52 in the Y direction is $W_1$, the width of the second region 53 in the Y direction is $W_2$, the electrical resistivity of the first region 52 is $\rho_1$, and the electrical resistivity of the second region 53 is $\rho_2$.

$$Rs = \left(\frac{\rho_1 \rho_2 W}{\rho_1 W_2 + \rho_2 W_1}\right)\frac{L}{H \times W} \qquad (2)$$

Accordingly, the resistance Rs can be matched between the electrode layers WL of the lower layer side and the upper layer side that have different widths W by setting the width $W_2$ of the second region 53 of the electrode layer WL of the lower layer side for which the width W of the entire electrode layer WL in the Y direction is relatively wide to be wider than the width $W_2$ of the second region 53 of the electrode layer WL of the upper layer side for which the width W of the entire electrode layer WL is relatively narrow.

Also, the resistance Rs can be matched between the electrode layers WL of the lower layer side and the upper layer side that have different widths W by setting the concentration of the additive (the carbon or the nitrogen) of the second region 53 of the electrode layer WL of the lower layer side to be higher than the concentration of the additive (the carbon or the nitrogen) of the second region 53 of the electrode layer WL of the upper layer side.

After the process of FIG. 9A, it is possible to add the carbon or the nitrogen to the regions of the electrode layers WL on the end portion side by exposing the end portions (the side walls) of the electrode layers WL exposed at the trenches 61 to, for example, a gas including carbon or nitrogen in a plasma atmosphere.

Figure 11B:
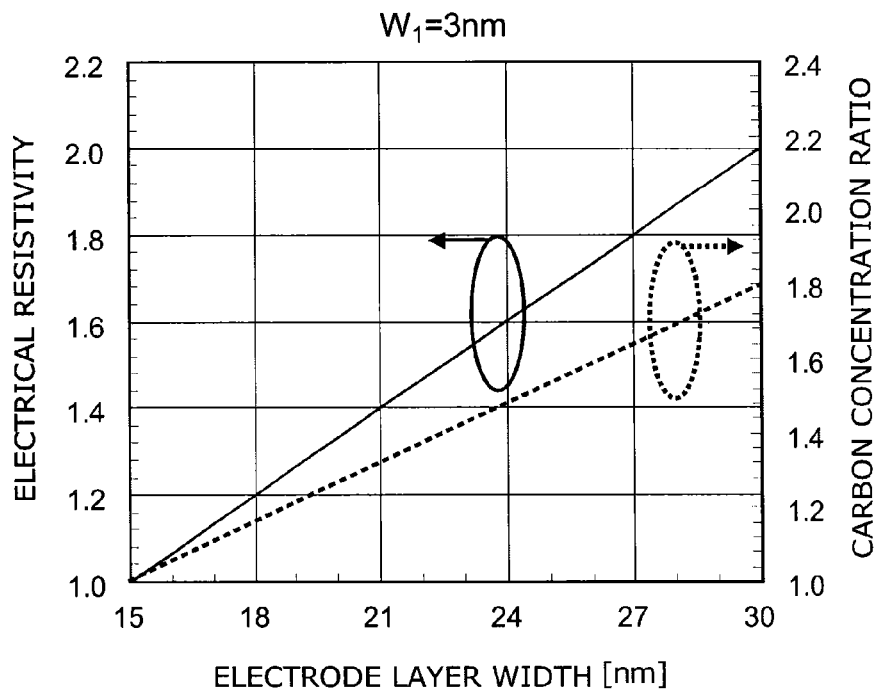

FIG. 11B is a graph of the calculation results of the electrical resistivity $\rho_2$ and the carbon concentration ratio of the second region 53 to cause the resistance Rs of the electrode layer WL to be constant over the change of the width W of the entire electrode layer WL which is the polycrystalline silicon layer for which the width $W_1$ of the first region 52 is fixed at 3 nm.

The calculations were made for the width W of the entire electrode layer WL in a range from 15 nm to 30 nm.

The width $W_2$ of the second region 53 is given by W−(3 nm).

The carbon concentration ratio shown on the vertical axis on the right side is the ratio in the case where the carbon concentration (atomic percent) in the second region 53 of the electrode layer WL having the width W of 15 nm is taken to be 1.

The electrical resistivity shown on the vertical axis on the left side is the ratio in the case where the electrical resistivity $\rho_2$ of the second region 53 of the electrode layer WL having the width W of 15 nm is taken to be 1.

To cause the resistance Rs of the electrode layer WL to be constant regardless of the width W of the electrode layer WL, the electrical resistivity $\rho_2$ of the second region 53 is appropriately set according to the difference of the widths W by setting the carbon concentration ratio of the second region 53 to be the carbon concentration ratio shown in FIG. 11B according to the difference of the widths W of each of the electrode layers WL.

Figure 12A:
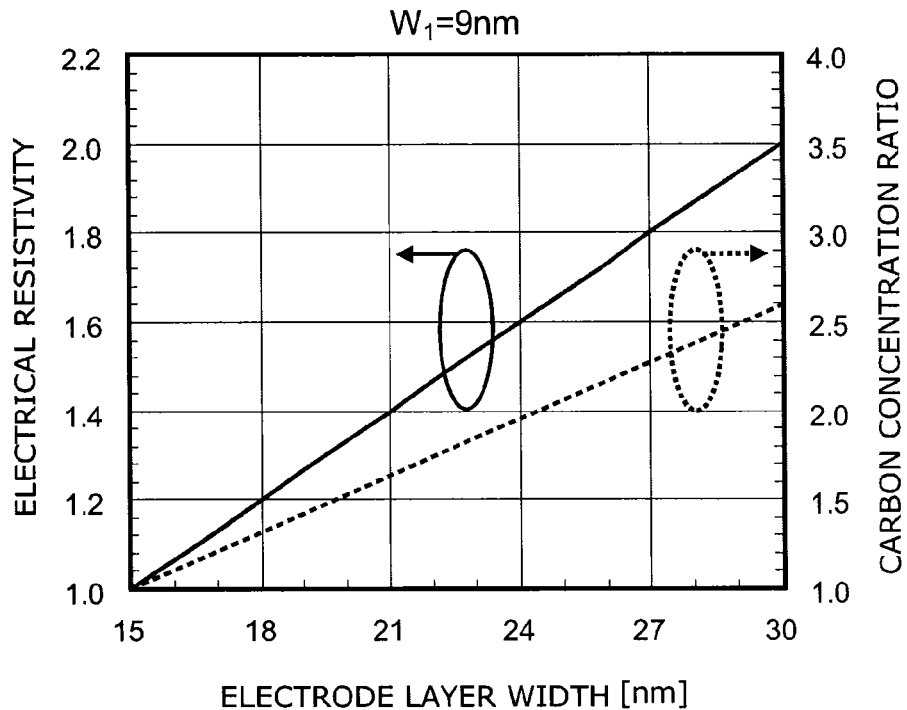

FIG. 12A is a graph of the calculation results of the electrical resistivity $\rho_2$ and the carbon concentration ratio of the second region 53 to cause the resistance Rs of the electrode layer WL to be constant over the change of the width W of the entire electrode layer WL which is the polycrystalline silicon layer for which the width $W_1$ of the first region 52 is fixed at 9 nm.

The calculations were made for the width W of the entire electrode layer WL in a range from 15 nm to 30 nm.

The width $W_2$ of the second region 53 is given by W−(9 nm).

The carbon concentration ratio shown on the vertical axis on the right side is the ratio in the case where the carbon concentration (atomic percent) in the second region 53 of the electrode layer WL having the width W of 15 nm is taken to be 1.

The electrical resistivity shown on the vertical axis on the left side is the ratio in the case where the electrical resistivity $\rho_2$ of the second region 53 of the electrode layer WL having the width W of 15 nm is taken to be 1.

To cause the resistance Rs of the electrode layer WL to be constant regardless of the width W of the electrode layer WL, the electrical resistivity $\rho_2$ of the second region 53 is appropriately set according to the difference of the widths W by setting the carbon concentration ratio of the second region 53 to be the carbon concentration ratio shown in FIG. 12A according to the difference of the widths W of each of the electrode layers WL.

Figure 12B:
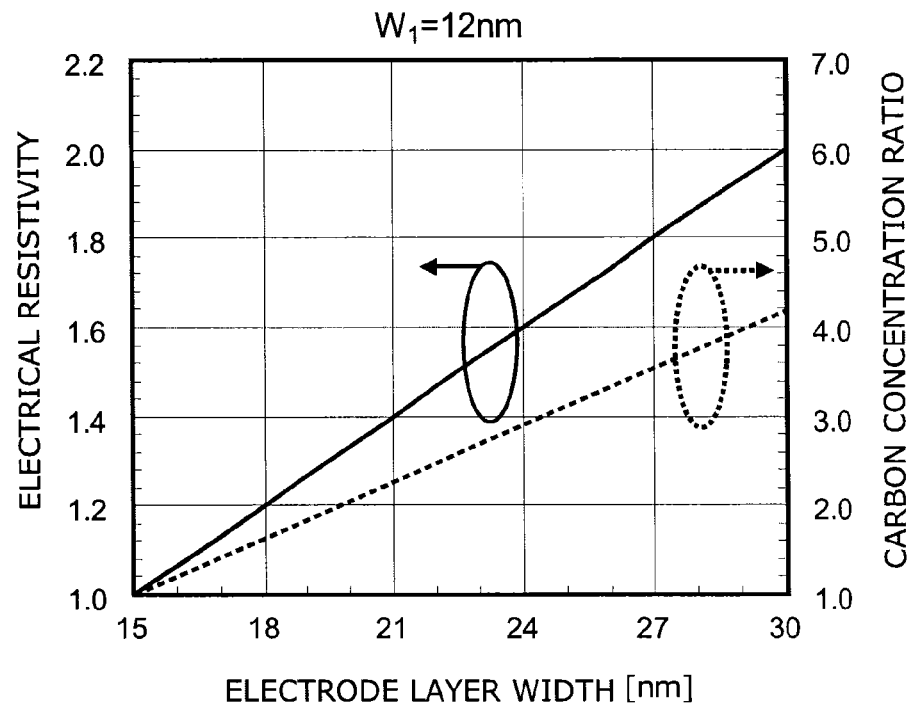

FIG. 12B is a graph of the calculation results of the electrical resistivity $\rho_2$ and the carbon concentration ratio of the second region 53 to cause the resistance Rs of the electrode layer WL to be constant over the change of the width W of the entire electrode layer WL which is the polycrystalline silicon layer for which the width $W_1$ of the first region 52 is fixed at 12 nm.

The calculations were made for the width W of the entire electrode layer WL in a range from 15 nm to 30 nm.

The width $W_2$ of the second region 53 is given by W−(12 nm).

The carbon concentration ratio shown on the vertical axis on the right side is the ratio in the case where the carbon concentration (atomic percent) in the second region 53 of the electrode layer WL having the width W of 15 nm is taken to be 1.

The electrical resistivity shown on the vertical axis on the left side is the ratio in the case where the electrical resistivity $\rho_2$ of the second region 53 of the electrode layer WL having the width W of 15 nm is taken to be 1.

To cause the resistance Rs of the electrode layer WL to be constant regardless of the width W of the electrode layer WL, the electrical resistivity $\rho_2$ of the second region 53 is appropriately set according to the difference of the widths W by setting the carbon concentration ratio of the second region 53 to be the carbon concentration ratio shown in FIG. 12B according to the difference of the widths W of each of the electrode layers WL.

From the graphs of FIG. 11B to FIG. 12B, even for the same width W of the entire electrode layer WL, the carbon concentration of the second region 53 is set to be higher as the electrode layer WL has a greater ratio of the width $W_1$ of the first region 52 with respect to the width $W_2$ of the second region 53.

Figure 14A:
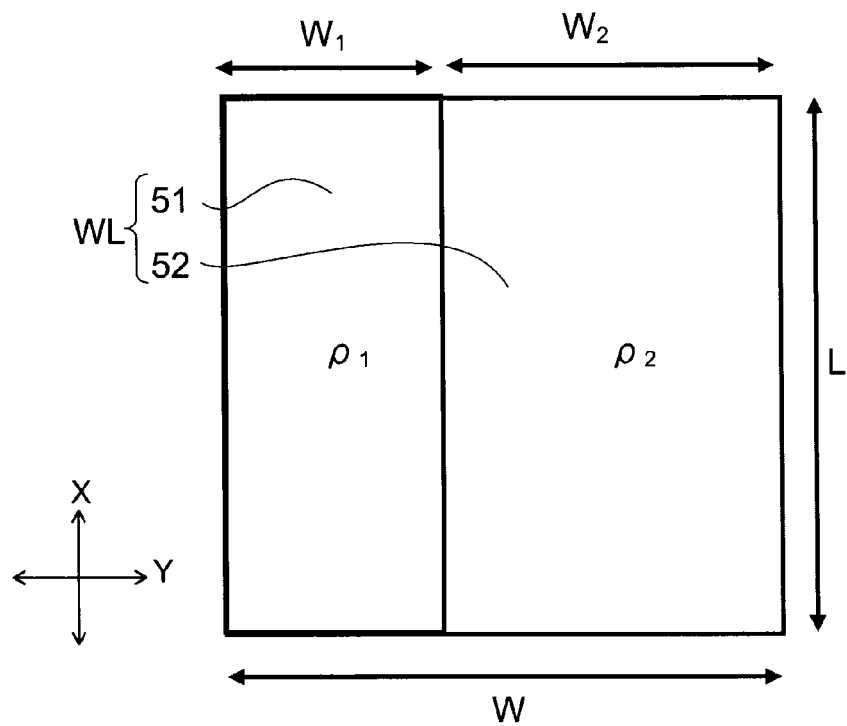
FIG. 14A is a schematic plan view of the electrode layer of the semiconductor memory device of the embodiment.

FIG. 14A is a schematic plan view of the electrode layer WL of another specific example having two regions divided inside the XY plane.

The metal silicide 51 is formed as the first region in a portion of the electrode layer WL which is the polycrystalline silicon layer that is conductive by an impurity such as boron, etc., being added. The second region of the electrode layer WL other than the first region where the metal silicide 51 is formed is the polycrystalline silicon 52 which has an electrical resistivity that is higher than that of the metal silicide 51.

The length L in the X direction is substantially the same between the metal silicide 51 and the polycrystalline silicon 52; and the thickness H also is substantially the same between the metal silicide 51 and the polycrystalline silicon 52. The resistance Rs of the entire electrode layer WL is shown in Formula (2) recited above, where the width of the entire electrode layer WL in the Y direction is W, the width of the metal silicide 51 in the Y direction is $W_1$, the width of the polycrystalline silicon 52 in the Y direction is $W_2$, the electrical resistivity of the metal silicide 51 is $\rho_1$, and the electrical resistivity of the polycrystalline silicon 52 is $\rho_2$.

Accordingly, the resistance Rs can be matched between the electrode layers WL of the lower layer side and the upper layer side that have different widths W by setting the width $W_2$ of the polycrystalline silicon 52 of the electrode layer WL of the lower layer side for which the width W of the entire electrode layer WL in the Y direction is relatively wide to be wider than the width $W_2$ of the polycrystalline silicon 52 of the electrode layer WL of the upper layer side for which the width W of the entire electrode layer WL is relatively narrow.

Conversely, the resistance Rs can be matched between the electrode layers WL of the lower layer side and the upper layer side that have different widths W by the width $W_1$ of the metal silicide 51 of the electrode layer WL of the lower layer side for which the width W of the entire electrode layer WL in the Y direction is relatively wide being narrower than the width $W_1$ of the metal silicide 51 of the electrode layer WL of the upper layer side for which the width W of the entire electrode layer WL is relatively narrow.

After forming the metal film 50 at the side walls of the trenches 61 in the process of FIG. 9B described above, the metal silicide 51 can be formed by causing the metal of the metal film 50 and the silicon of the electrode layers WL to react by heat treatment.

The metal silicide amount of the electrode layer WL can be controlled by the film thickness control of the metal film 50. The metal silicide amount of the electrode layer WL of the lower layer side can be suppressed compared to the upper layer side by causing the film thickness of the metal film 50 to be thinner on the bottom portion side than at the upper portion of the trench 61; and it is possible for the width $W_1$ of the metal silicide 51 of the lower layer side to be narrower than the width $W_1$ of the metal silicide 51 of the upper layer side.

For the trench 61 which has a large aspect ratio, there is a tendency for the film formation source-material gas concentration to be higher at the upper portion than at the bottom portion of the trench 61; and it is easily controllable to cause the film thickness of the metal film 50 formed on the bottom portion side of the trench 61 to be thinner than the film thickness of the metal film 50 formed on the upper portion side.

Figure 14B:
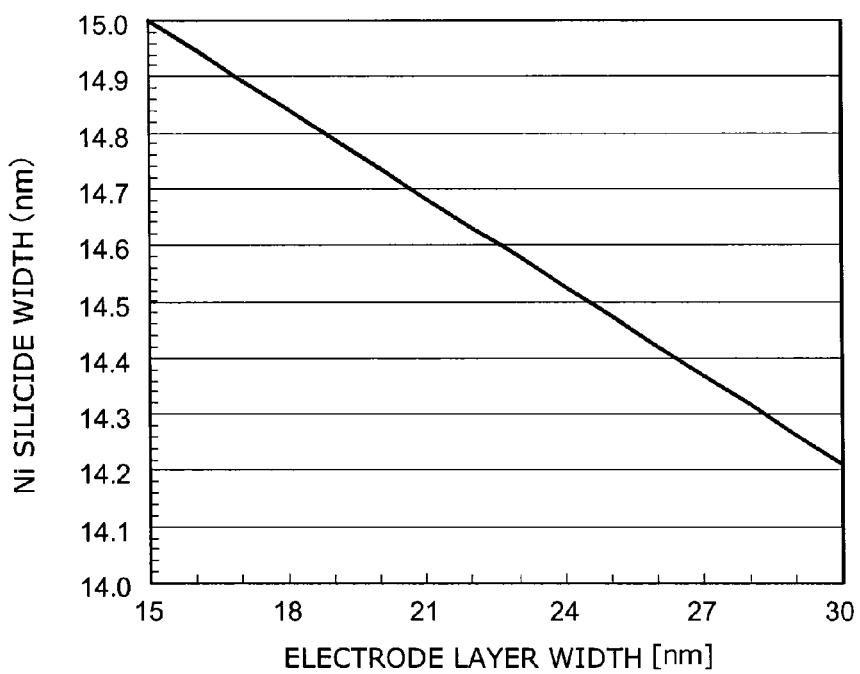
FIG. 14B is a graph showing a relationship of a width of an nickel silicide to a width of an electrode layer.

FIG. 14B is a graph of the calculation results of the width $W_1$ of the metal silicide 51 to cause the resistance Rs of the electrode layer WL to be constant over the change of the width W of the entire electrode layer WL including the metal silicide 51 and the polycrystalline silicon 52.

The calculations were made with nickel silicide selected as the metal silicide 51, the electrical resistivity $\rho_1$ of the metal silicide 51 being 50 μΩcm, and the electrical resistivity $\rho_2$ of the polycrystalline silicon 52 being 1 mΩcm.

The calculations were made for the width W of the entire electrode layer WL in a range from 15 nm to 30 nm.

The width $W_2$ of the polycrystalline silicon 52 is given by $W-W_1$.

To cause the resistance Rs of the electrode layer WL to be constant regardless of the width W of the electrode layer WL, the width $W_1$ of the metal silicide 51 is set to be, for example, the value shown in FIG. 14B according to the difference of the widths W of each of the electrode layers WL.

Figure 15A:
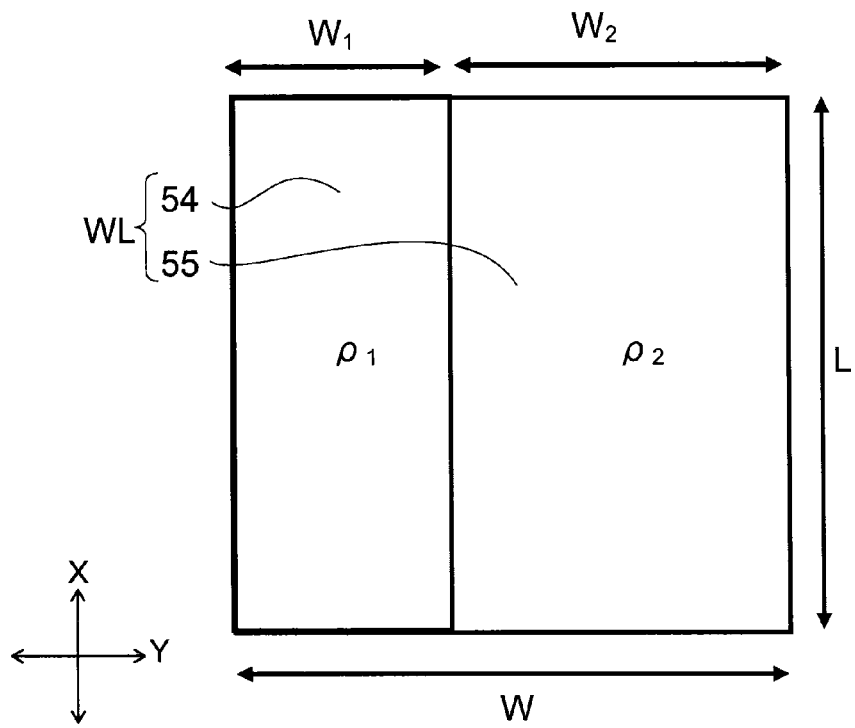
FIG. 15A is a schematic plan view of the electrode layer of the semiconductor memory device of the embodiment.

FIG. 15A is a schematic plan view of the electrode layer WL of still another specific example having two regions divided inside the XY plane.

The electrode layer WL is a stacked film of a tungsten film 54 and a tungsten nitride film 55. In FIG. 15A, the tungsten nitride film 55 and the tungsten film 54 are stacked in the Y direction in order from the side of the memory film 30 provided adjacently to the right edge of the electrode layer WL in the Y direction.

The region where the tungsten film 54 is formed is taken to be the first region; and the tungsten nitride film 55 which has an electrical resistivity that is higher than that of the tungsten film 54 is formed in the second region which is adjacent to the first region in the Y direction.

The length L in the X direction is substantially the same between the tungsten film 54 and the tungsten nitride film 55; and the thickness H also is substantially the same between the tungsten film 54 and the tungsten nitride film 55. The resistance Rs of the entire electrode layer WL is shown in Formula (2) recited above, where the width of the entire electrode layer WL in the Y direction is W, the width of the tungsten film 54 in the Y direction is $W_1$, the width of the tungsten nitride film 55 in the Y direction is $W_2$, the electrical resistivity of the tungsten film 54 is $\rho_1$, and the electrical resistivity of the tungsten nitride film 55 is $\rho_2$.

Accordingly, the resistance Rs can be matched between the electrode layers WL of the lower layer side and the upper layer side that have different widths W by setting the width $W_2$ of the tungsten nitride film 55 of the electrode layer WL of the lower layer side for which the width W of the entire electrode layer WL in the Y direction is relatively wide to be wider than the width $W_2$ of the tungsten nitride film 55 of the electrode layer WL of the upper layer side for which the width W of the entire electrode layer WL is relatively narrow.

Conversely, the resistance Rs can be matched between the electrode layers WL of the lower layer side and the upper layer side that have different widths W by the width $W_1$ of the tungsten film 54 of the electrode layer WL of the lower layer side for which the width W of the entire electrode layer WL in the Y direction is relatively wide being narrower than the width $W_1$ of the tungsten film 54 of the electrode layer WL of the upper layer side for which the width W of the entire electrode layer WL is relatively narrow.

Figure 15B:
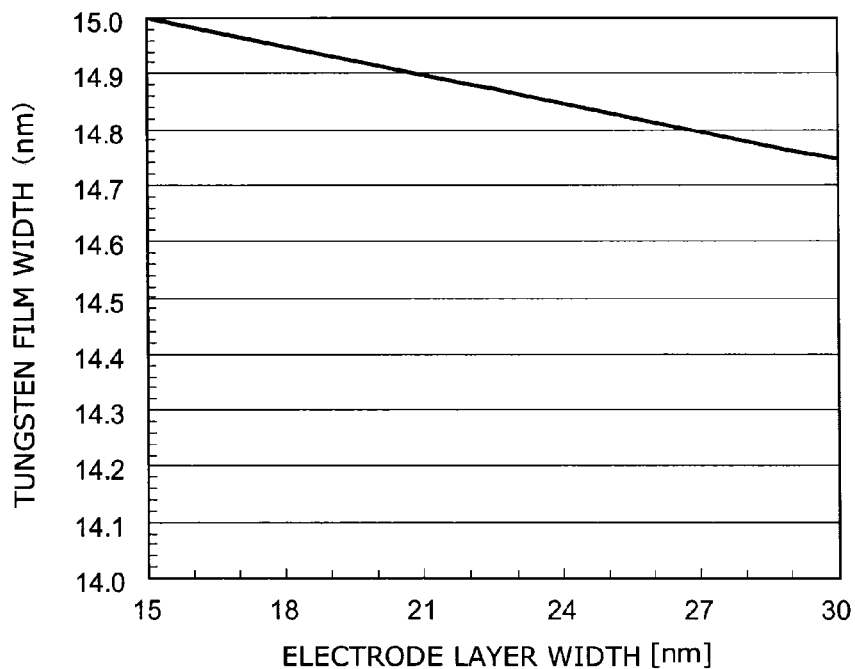
FIG. 15B is a graph showing a relationship of a width of a tungsten film to a width of an electrode layer.

FIG. 15B is a graph of the calculation results of the width $W_1$ of the tungsten film 54 to cause the resistance Rs of the electrode layer WL to be constant over the change of the width W of the entire electrode layer WL including the tungsten film 54 and the tungsten nitride film 55.

The calculations were made with the electrical resistivity $\rho_1$ of the tungsten film 54 being $5\times10^{-6}$ Ωcm and the electrical resistivity $\rho_2$ of the tungsten nitride film 55 being $3\times10^{-4}$ Ωcm.

The calculations were made for the width W of the entire electrode layer WL in a range from 15 nm to 30 nm.

The width $W_2$ of the tungsten nitride film 55 is given by $W-W_1$.

To cause the resistance Rs of the electrode layer WL to be constant regardless of the width W of the electrode layer WL, the width $W_1$ of the tungsten film 54 is set to be, for example, the value shown in FIG. 15B according to the difference of the widths W of each of the electrode layers WL.

By setting the nitrogen concentration of the tungsten nitride film 55 of the electrode layer WL of the lower layer side to be higher than the nitrogen concentration of the tungsten nitride film 55 of the electrode layer WL of the upper layer side, the electrical resistivity $\rho_2$ of the tungsten nitride film 55 of the electrode layer WL of the lower layer side can be higher than the electrical resistivity $\rho_2$ of the tungsten nitride film 55 of the electrode layer WL of the upper layer side; and as a result, the resistance Rs can be matched between the electrode layers WL of the lower layer side and the upper layer side that have different widths W.

Figure 17A:
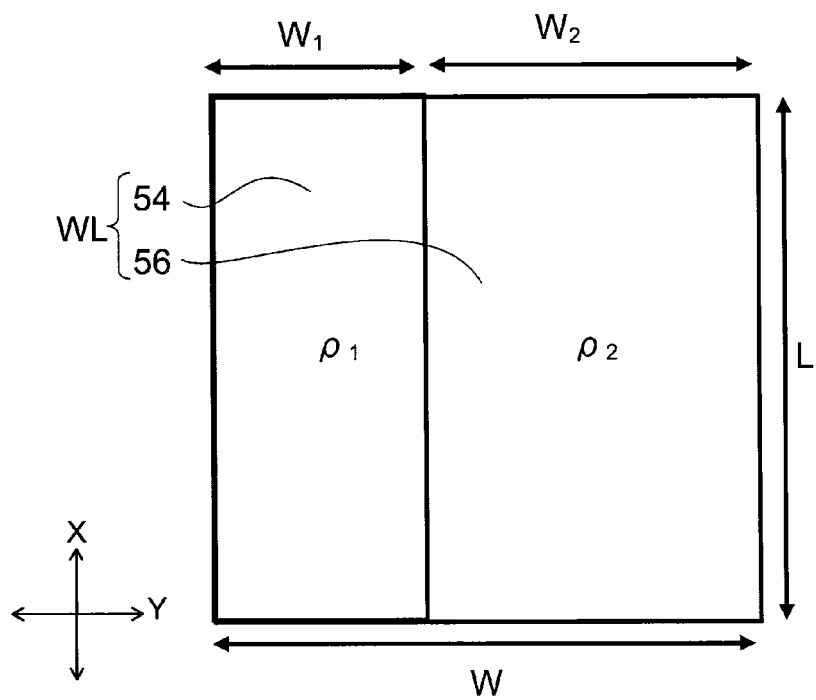
FIG. 17A is a schematic plan view of the electrode layer of the semiconductor memory device of the embodiment.

FIG. 17A is a schematic plan view of the electrode layer WL of still another specific example having two regions divided inside the XY plane.

The electrode layer WL is a stacked film of the tungsten film 54 and a tantalum nitride film 56. In FIG. 17A, the tantalum nitride film 56 and the tungsten film 54 are stacked in the Y direction in order from the side of the memory film 30 provided adjacently to the right edge of the electrode layer WL in the Y direction.

The region where the tungsten film 54 is formed is taken to be the first region; and the tantalum nitride film 56 which has an electrical resistivity that is higher than that of the tungsten film 54 is formed in the second region which is adjacent to the first region in the Y direction.

The length L in the X direction is substantially the same between the tungsten film 54 and the tantalum nitride film 56; and the thickness H also is substantially the same between the tungsten film 54 and the tantalum nitride film 56. The resistance Rs of the entire electrode layer WL is shown in Formula (2) recited above, where the width of the entire electrode layer WL in the Y direction is W, the width of the tungsten film 54 in the Y direction is $W_1$, the width of the tantalum nitride film 56 in the Y direction is $W_2$, the electrical resistivity of the tungsten film 54 is $\rho_1$, and the electrical resistivity of the tantalum nitride film 56 is $\rho_2$.

Accordingly, the resistance Rs can be matched between the electrode layers WL of the lower layer side and the upper layer side that have different widths W by setting the width $W_2$ of the tantalum nitride film 56 of the electrode layer WL of the lower layer side for which the width W of the entire electrode layer WL in the Y direction is relatively wide to be wider than the width $W_2$ of the tantalum nitride film 56 of the electrode layer WL of the upper layer side for which the width W of the entire electrode layer WL is relatively narrow.

Conversely, the resistance Rs can be matched between the electrode layers WL of the lower layer side and the upper layer side that have different widths W by the width $W_1$ of the tungsten film 54 of the electrode layer WL of the lower layer side for which the width W of the entire electrode layer WL in the Y direction is relatively wide being narrower than the width $W_1$ of the tungsten film 54 of the electrode layer WL of the upper layer side for which the width W of the entire electrode layer WL is relatively narrow.

Figure 17B:
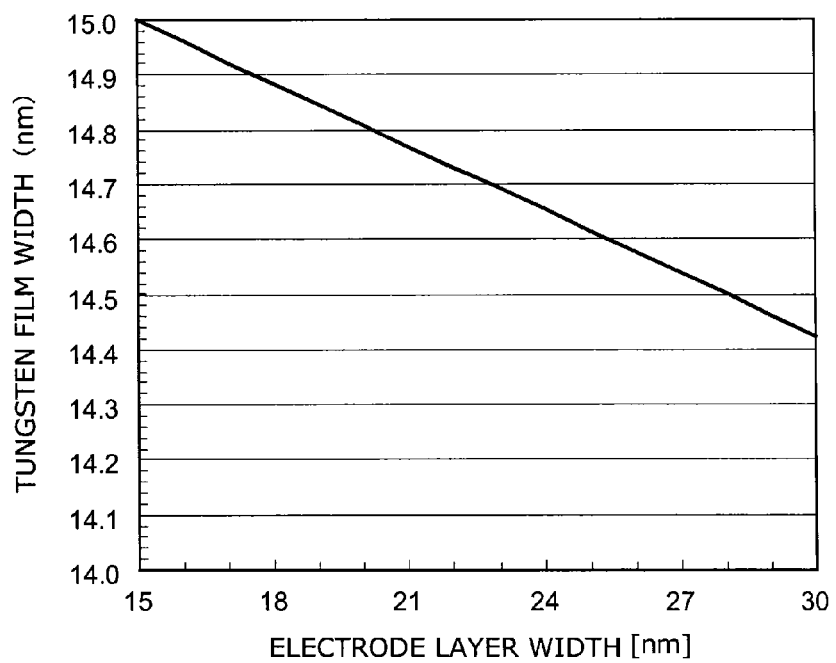
FIG. 17B is a graph showing a relationship of a width of a tungsten film to a width of an electrode layer.

FIG. 17B is a graph of the calculation results of the width $W_1$ of the tungsten film 54 to cause the resistance Rs of the electrode layer WL to be constant over the change of the width W of the entire electrode layer WL including the tungsten film 54 and the tantalum nitride film 56.

The calculations were made with the electrical resistivity $\rho_1$ of the tungsten film 54 being $5 \times 10^{-6}$ $\Omega$cm and the electrical resistivity $\rho_2$ of the tantalum nitride film 56 being $1.35 \times 10^{-4}$ $\Omega$cm.

The calculations were made for the width W of the entire electrode layer WL in a range from 15 nm to 30 nm.

The width $W_2$ of the tantalum nitride film 56 is given by $W - W_1$.

To cause the resistance Rs of the electrode layer WL to be constant regardless of the width W of the electrode layer WL, the width $W_1$ of the tungsten film 54 is set to be, for example, the value shown in FIG. 17B according to the difference of the widths W of each of the electrode layers WL.

By setting the nitrogen concentration of the tantalum nitride film 56 of the electrode layer WL of the lower layer side to be higher than the nitrogen concentration of the tantalum nitride film 56 of the electrode layer WL of the upper layer side, the electrical resistivity $\rho_2$ of the tantalum nitride film 56 of the electrode layer WL of the lower layer side can be higher than the electrical resistivity $\rho_2$ of the tantalum nitride film 56 of the electrode layer WL of the upper layer side; and as a result, the resistance Rs can be matched between the electrode layers WL of the lower layer side and the upper layer side that have different widths W.

A method for forming a memory cell array 2 according to another embodiment will now be described with reference to FIGS. 10A to D.

Figure 10A:
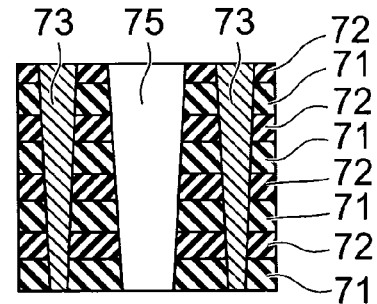
FIGS. 10A to 10D are schematic cross-sectional views showing a method for manufacturing a memory cell array of a semiconductor memory device of another embodiment.

As shown in FIG. 10A, a silicon nitride film 71 that is used as a sacrificial film and removed in a subsequent process and a silicon oxide film 72 that is used to form the inter-electrode insulating layer are multiply stacked alternately on a not-shown substrate.

A hole extending in the stacking direction (the Z direction) of the silicon nitride films 71 and the silicon oxide films 72 is made in the stacked body to pierce the stacked body; and a channel body 73 is formed inside the hole.

After forming the channel body 73, a trench 75 extending in the Z direction is made in the stacked body; and the stacked body is separated in the Y direction parallel to the major surface of the substrate by the trench 75.

Figure 10B:
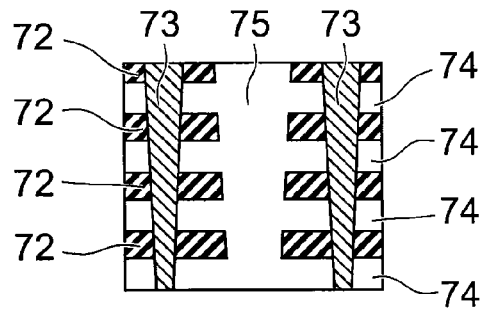

Then, the silicon nitride films 71 are removed by etching via the trench 75. Thereby, as shown in FIG. 10B, a gap 74 is made between the silicon oxide films 72.

Figure 10C:
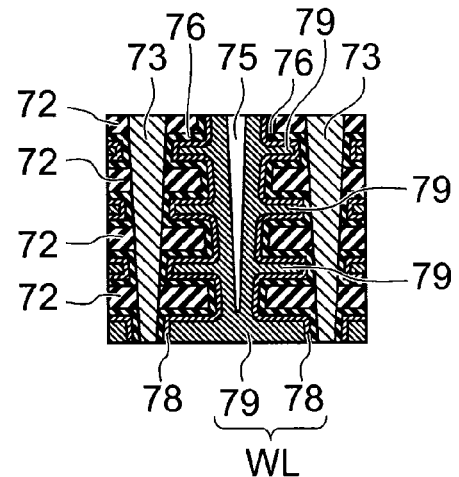

Continuing as shown in FIG. 10C, a memory film 76 including the charge storage film is formed in the gap 74. The memory film 76 is formed conformally along the channel body 73 and the silicon oxide films 72.

The electrode layer WL is stacked on the memory film 76. The electrode layer WL includes a tungsten nitride film 78 and a tungsten film 79 stacked in order from the memory film 76 side.

Figure 10D:
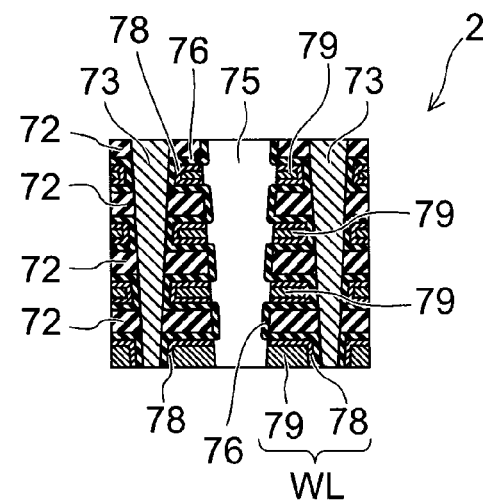

After forming the electrode layers WL, the electrode layers WL inside the trench 75 are removed by dry etching. The electrode layers WL that were linked inside the trench 75 are separated in the Y direction. The electrode layers WL that are separated in the Y direction are provided around the channel body 73 with the memory film 76 interposed between the channel body 73 and the electrode layers WL as shown in FIG. 10D.

Subsequently, an insulating film is filled into the trench 75.

In the method for manufacturing the memory cell array 2 as well, in the processes that make the trench 75 and the hole to form the channel body 73, in the case where the number of layers of the electrode layer WL increases and the aspect ratios of the hole and the trench 75 increase, the side walls of the hole and the trench 75 become tapered surfaces that are not perpendicular to the substrate major surface but are tilted; and it is easy for the diameter of the hole and the width (the width in the Y direction) of the trench 75 to be narrower on the bottom side than on the top side.

Accordingly, the width in the Y direction of the electrode layer WL of the lower layer side becomes wider than the width in the Y direction of the electrode layer WL of the upper layer side.

Therefore, in the memory cell array 2 shown in FIG. 10D as well, by setting the width in the Y direction of the tungsten nitride film 78 of the electrode layer WL of the lower layer side to be wider than the width in the Y direction of the tungsten nitride film 78 of the electrode layer WL of the upper layer side, the resistance of the electrode layer WL can be matched between the upper layer side and the lower layer side even in the case where fluctuation of the width of the electrode layer WL in the Y direction occurs between the upper layer side and the lower layer side.

Or, by setting the nitrogen concentration inside the tungsten nitride film 78 of the electrode layer WL of the lower layer side to be higher than the nitrogen concentration inside the tungsten nitride film 78 of the electrode layer WL of the upper layer side, the resistance of the electrode layer WL can be matched between the upper layer side and the lower layer side even in the case where fluctuation of the width of the electrode layer WL in the Y direction occurs between the upper layer side and the lower layer side.

Or, by setting the nitrogen concentration inside the tungsten film 79 of the electrode layer WL of the lower layer side to be higher than the nitrogen concentration inside the tungsten film 79 of the electrode layer WL of the upper layer side, the resistance of the electrode layer WL can be matched between the upper layer side and the lower layer side even in the case where fluctuation of the width of the electrode layer WL in the Y direction occurs between the upper layer side and the lower layer side.

According to the embodiment described above, the fluctuation of the operation time between the memory cells MC can be suppressed by suppressing the fluctuation of the resistance between the electrode layers WL; and a semiconductor memory device having high reliability can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
    a substrate;
    a stacked body including a plurality of electrode layers provided above the substrate and a plurality of insulating layers provided respectively in each space between the electrode layers;
    a plurality of insulative separating films extending in a stacking direction of the electrode layers and the insulating layers inside the stacked body to separate the stacked body into a plurality;
    a channel body extending in the stacking direction inside the stacked body between the plurality of insulative separating films; and
    a memory film provided between the channel body and the electrode layers, and including a charge storage film,
    a width of an electrode layer of a lower layer side between the insulative separating film and the memory film being greater than a width of an electrode layer of an upper layer side between the insulative separating film and the memory film,
    an electrical resistivity of the electrode layer being higher for the electrode layer of the lower layer side having the greater width than for the electrode layer of the upper layer side having the lesser width.

2. The semiconductor memory device according to claim 1, wherein an additive to increase the electrical resistivity of the electrode layer is included in a higher concentration in the electrode layer of the lower layer side than in the electrode layer of the upper layer side.

3. The semiconductor memory device according to claim 2, wherein
    the electrode layer is a silicon layer that is conductive or a metal silicide layer, and
    the additive is carbon or nitrogen.

4. The semiconductor memory device according to claim 1, wherein
    the electrode layer is a tungsten layer, and
    oxygen is included in a higher concentration in the electrode layer of the lower layer side than in the electrode layer of the upper layer side.

5. The semiconductor memory device according to claim 1, wherein
    the electrode layer is a tungsten layer, and
    nitrogen is included in a higher concentration in the electrode layer of the lower layer side than in the electrode layer of the upper layer side.

6. The semiconductor memory device according to claim 1, wherein
    the electrode layer is a tantalum nitride layer, and
    nitrogen is included in a higher concentration in the electrode layer of the lower layer side than in the electrode layer of the upper layer side.

7. The semiconductor memory device according to claim 1, wherein
    the electrode layer includes a tungsten nitride film and a tungsten film stacked in order from the memory film side, and
    a nitrogen concentration of the tungsten nitride film of the electrode layer of the lower layer side is higher than a nitrogen concentration of the tungsten nitride film of the electrode layer of the upper layer side.

8. The semiconductor memory device according to claim 1, wherein
    the electrode layer includes a tantalum nitride film and a tungsten film stacked in order from the memory film side, and
    a nitrogen concentration of the tantalum nitride film of the electrode layer of the lower layer side is higher than a nitrogen concentration of the tantalum nitride film of the electrode layer of the upper layer side.

9. The semiconductor memory device according to claim 1, wherein
    the memory film is provided in a tubular configuration around the channel body,
    the electrode layers are provided around the channel body with the memory film interposed between the channel body and the electrode layers, and
    a diameter of the memory film having the tubular configuration is smaller at the electrode layer of the lower layer side provided around the memory film than at the electrode layer of the upper layer side provided around the memory film.

10. The semiconductor memory device according to claim 1, wherein a width of a lower portion of the insulative separating films adjacent to the electrode layer of the lower layer side is less than a width of an upper portion of the insulative separating films adjacent to the electrode layer of the upper layer side.

11. A semiconductor memory device, comprising:
    a substrate;
    a stacked body including a plurality of electrode layers provided above the substrate and a plurality of insulating layers provided respectively in each space between the electrode layers;
    a plurality of insulative separating films extending in a stacking direction of the electrode layers and the insulating layers inside the stacked body to separate the stacked body into a plurality;
    a channel body extending in the stacking direction inside the stacked body between the plurality of insulative separating films; and
    a memory film provided between the channel body and the electrode layers, and including a charge storage film,
    a width of an electrode layer of a lower layer side between the insulative separating film and the memory film being greater than a width of an electrode layer of an upper layer side between the insulative separating film and the memory film,
    each of the electrode layers having a first region and a second region, an electrical resistivity of the second region being higher than an electrical resistivity of the first region, a width of the second region of the electrode layer of the lower layer side being greater than a width of the second region of the electrode layer of the upper layer side.

12. The semiconductor memory device according to claim 11, wherein a width of the first region of the electrode layer of the lower layer side is less than a width of the first region of the electrode layer of the upper layer side.

13. The semiconductor memory device according to claim 11, wherein the second region includes an additive to increase the electrical resistivity of the electrode layer, and the first region does not include the additive.

14. The semiconductor memory device according to claim 13, wherein
the electrode layer is a silicon layer that is conductive or a metal silicide layer, and
the additive is carbon or nitrogen.

15. The semiconductor memory device according to claim 13, wherein a concentration of the additive of the second region of the electrode layer of the lower layer side is higher than a concentration of the additive of the second region of the electrode layer of the upper layer side.

16. The semiconductor memory device according to claim 11, wherein the first region is a metal silicide, and the second region is silicon that is conductive.

17. The semiconductor memory device according to claim 11, wherein a tungsten film is provided in the first region, and a tungsten nitride film is provided in the second region.

18. The semiconductor memory device according to claim 11, wherein a tungsten film is provided in the first region, and a tantalum nitride film is provided in the second region.

19. The semiconductor memory device according to claim 11, wherein
the memory film is provided in a tubular configuration around the channel body,
the electrode layers are provided around the channel body with the memory film interposed between the channel body and the electrode layers, and
a diameter of the memory film having the tubular configuration is smaller at the electrode layer of the lower layer side provided around the memory film than at the electrode layer of the upper layer side provided around the memory film.

20. The semiconductor memory device according to claim 11, wherein a width of a lower portion of the insulative separating films adjacent to the electrode layer of the lower layer side is less than a width of an upper portion of the insulative separating films adjacent to the electrode layer of the upper layer side.

* * * * *